(12) United States Patent
Koide

(10) Patent No.: US 9,780,125 B2
(45) Date of Patent: Oct. 3, 2017

(54) TRANSISTOR SUBSTRATE AND DISPLAY DEVICE

(71) Applicant: Japan Display Inc., Tokyo (JP)

(72) Inventor: Gen Koide, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/346,810

(22) Filed: Nov. 9, 2016

(65) Prior Publication Data
US 2017/0162599 A1  Jun. 8, 2017

(30) Foreign Application Priority Data

Dec. 2, 2015  (JP) .................................. 2015-235989

(51) Int. Cl.
| | |
|---|---|
| H01L 27/12 | (2006.01) |
| G02F 1/1368 | (2006.01) |
| G02F 1/1343 | (2006.01) |
| G02F 1/1362 | (2006.01) |
| G06F 3/041 | (2006.01) |
| G02F 1/1333 | (2006.01) |
| G06F 3/044 | (2006.01) |
| G09G 3/36 | (2006.01) |
| G02F 1/1335 | (2006.01) |

(52) U.S. Cl.
CPC .......... *H01L 27/124* (2013.01); *G02F 1/1368* (2013.01); *G02F 1/13439* (2013.01); *G02F 1/134336* (2013.01); *G02F 1/136286* (2013.01); *G02F 1/13338* (2013.01); *G02F 1/133345* (2013.01); *G02F 1/133514* (2013.01); *G02F 2001/134345* (2013.01); *G02F 2201/121* (2013.01); *G02F 2201/123* (2013.01); *G02F 2203/04* (2013.01); *G06F 3/044* (2013.01); *G06F 3/0412* (2013.01); *G06F 2203/04108* (2013.01); *G09G 3/3677* (2013.01); *G09G 3/3688* (2013.01); *G09G 2300/0452* (2013.01)

(58) Field of Classification Search
CPC . G02F 1/1368; H01L 27/1222; H01L 27/124; H01L 27/1244; H01L 27/1251; H01L 27/1296
See application file for complete search history.

(56) References Cited

U.S. PATENT DOCUMENTS

2004/0062113 A1*  4/2004  Sekino ..................... G11C 8/12
                                                              365/202
2005/0139835 A1*  6/2005  Lee ..................... H01L 27/1214
                                                              257/72

FOREIGN PATENT DOCUMENTS

| JP | H11-84428 A | 3/1999 |
| JP | 2014-032282 A | 2/2014 |

* cited by examiner

*Primary Examiner* — Daniel Shook
(74) *Attorney, Agent, or Firm* — Typha IP LLC

(57) ABSTRACT

A transistor substrate includes a plurality of first transistors formed between a power supply wire and a first conductive wire, and a plurality of second transistors formed between the power supply wire and a second conductive wire. A length of a portion of the power supply wire between the plurality of second transistors and a drive signal generation circuit is longer than a length of a portion of the power supply wire between the plurality of first transistors and the drive signal generation circuit, and a total sum of channel widths of second channels included in the plurality of second transistors is wider than a total sum of channel widths of first channels included in the plurality of first transistors.

20 Claims, 15 Drawing Sheets

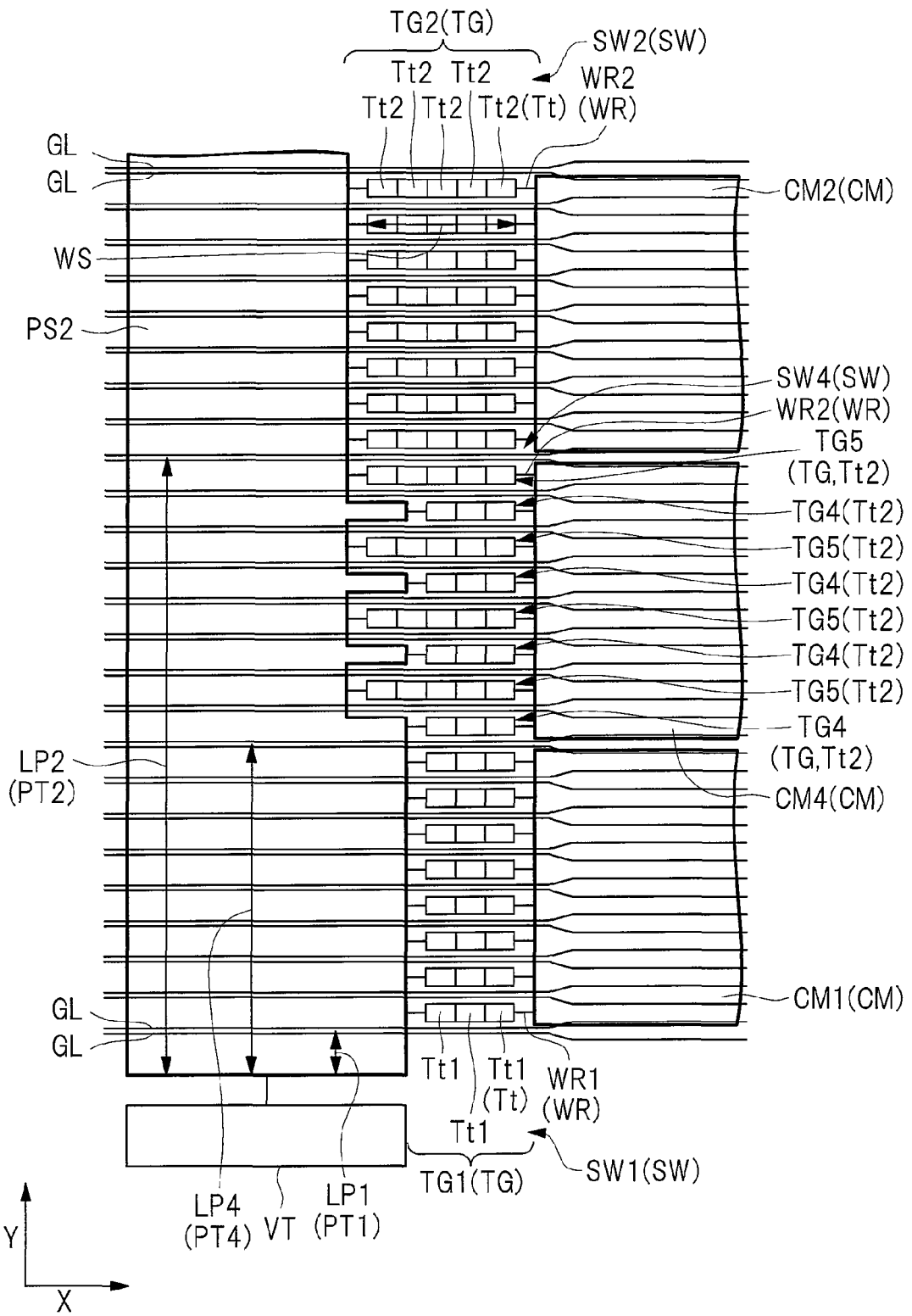

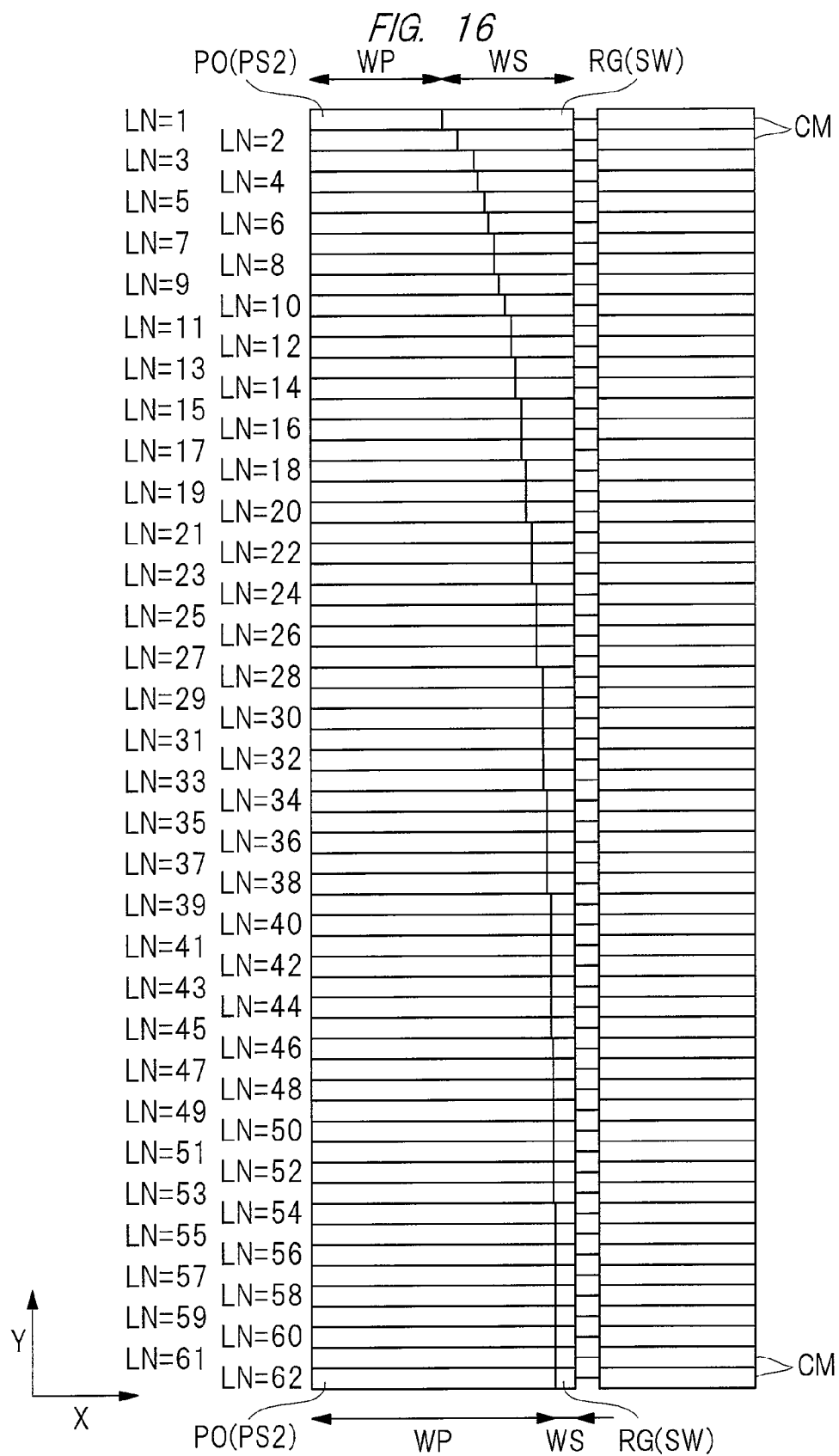

TRANSISTOR SUBSTRATE AND DISPLAY DEVICE

CROSS-REFERENCE TO RELATED APPLICATION

The present application claims priority from Japanese Patent Application No. 2015-235989 filed on Dec. 2, 2015, the content of which is hereby incorporated by reference into this application.

TECHNICAL FIELD OF THE INVENTION

The present invention relates to a transistor substrate and a display device and for example, relates to a technique which is effectively applied to a transistor substrate including a plurality of transistors and a display device.

BACKGROUND OF THE INVENTION

There are display devices in which a scan signal is supplied to a plurality of pixels provided in a display region through a plurality of scan lines, and a pixel signal is supplied through a plurality of signal lines, thereby displaying an image. In such display devices, there is a demand for reduction in width of a frame region outside the display region in order to reduce a size of the display device and increase the display region.

The plurality of pixels are formed by intersection of the plurality of scan lines and the plurality of signal lines. Each of the pixels includes a transistor and a pixel electrode. In addition, the plurality of pixels share a drive electrode referred to also as a common electrode. The drive electrode extends in a direction along, for example, the scan line, and a plurality of the drive electrodes are arrayed in a direction along, for example, the signal line. The pixel electrode and the drive electrode are formed in a transistor substrate in which the transistor is formed, for example.

In such display devices, a signal for display which is configured to display an image is input to the drive electrode from a power supply wire. In addition, the signal for display and a signal for touch detection are input to the drive electrode in a switching manner when the display device has a touch detection function.

Japanese Patent Application Laid-Open Publication No. 2014-32282 (Patent Document 1) describes a technique in which a display device is provided with a display pixel including a switching element and a pixel electrode and arranged to correspond to each portion at which a plurality of gate lines and a plurality of source lines intersect each other, and a counter electrode facing the pixel electrode.

Japanese Patent Application Laid-Open Publication No. H11-84428 A (Patent Document 2) describes a technique in which a display device includes a first pixel electrode electrically connected to one of a source electrode and a drain electrode of a first thin film transistor, a second pixel electrode electrically connected to one of a source electrode and a drain electrode of a second thin film transistor, and a common electrode facing the first and the second pixel electrodes.

SUMMARY OF THE INVENTION

Such display devices include the power supply wire and a plurality of switching units. The plurality of switching units supply the signals for display or touch detection from the power supply wire to each of the plurality of drive electrodes in a switching manner based on a drive signal from a drive electrode driver.

A time constant when the signal is input to the drive electrode is proportional to a sum of a resistance in an ON-state of the switching unit connected between each of the plurality of drive electrodes and the power supply wire, and a resistance of a portion of the power supply wire between the corresponding switching unit and a control circuit. Thus, the time constant becomes larger in the drive electrode farther from the control circuit and becomes smaller in the drive electrode closer to the control circuit.

Here, the drive electrode having the largest time constant among the plurality of drive electrodes has the greatest influence on a touch detection property or a display property. Thus, the influence of the drive electrode close to the control circuit on the touch detection property or the display property is small, but the influence of the drive electrode far from the control circuit on the touch detection property or the display property is great. Accordingly, there is a risk that the touch detection property or the display property of the display device deteriorates as the sum of the resistance in the ON-state of the switching unit and the resistance of the portion of the power supply wire between the corresponding switching unit and the control circuit increases in the drive electrode which is far from the control circuit.

The present invention has been made in order to solve the above-described problem of the related art, and an object thereof is to provide a transistor substrate and a display device which are capable of reducing a time constant when a signal is input to a drive electrode far from a control circuit.

The typical ones of the inventions disclosed in the present application will be briefly described as follows.

As an aspect of an embodiment of the present invention, a transistor substrate has a display region in which a pixel is formed and a peripheral region positioned outside the display region. The transistor substrate includes: a common wire formed in the peripheral region; a control circuit connected to one end of the common wire; a first conductive wire and a second conductive wire which are formed to be spaced apart from the common wire; a plurality of first transistors formed between the common wire and the first conductive wire; and a plurality of second transistors formed between the common wire and the second conductive wire. Each of the plurality of first transistors includes: a first gate electrode; a first A electrode and a first B electrode which are formed on both sides of the first gate electrode to sandwich the first gate electrode; and a first channel facing the first gate electrode. Each of the plurality of second transistors includes: a second gate electrode; a second A electrode and a second B electrode which are formed on both sides of the second gate electrode to sandwich the second gate electrode; and a second channel facing the second gate electrode. The first A electrode is connected to the first conductive wire, and the first B electrode is connected to the common wire, in each of the plurality of first transistors, and the second A electrode is connected to the second conductive wire, and the second B electrode is connected to the common wire, in each of the plurality of second transistors. A length of a portion of the common wire between the plurality of second transistors and the control circuit is longer than a length of a portion of the common wire between the plurality of first transistors and the control circuit, and a total sum of channel widths of the second channels included in the plurality of second transistors is wider than a total sum of channel widths of the first channels included in the plurality of first transistors.

In addition, as another aspect of the embodiment of the present invention, when a direction intersecting an extending direction of the common wire is set to a width direction, an area of a portion of the common wire which faces a region in which the plurality of second transistors are formed in the width direction may be smaller than an area of a portion of the common wire which faces a region in which the plurality of first transistors are formed in the width direction.

In addition, as another aspect of the embodiment of the present invention, the transistor substrate may further include: a third conductive wire formed to be spaced apart from the common wire; and a plurality of third transistors formed between the common wire and the third conductive wire. Each of the plurality of third transistors may include: a third gate electrode; a third A electrode and a third B electrode which are formed on both sides of the third gate electrode to sandwich the third gate electrode; and a third channel facing the third gate electrode. The third A electrode may be connected to the third conductive wire, and the third B electrode maybe connected to the common wire, in each of the plurality of third transistors. A length of a portion of the common wire between the plurality of third transistors and the control circuit may be longer than the length of the portion of the common wire between the plurality of second transistors and the control circuit, and a total sum of channel widths of the third channels included in the plurality of third transistors may be wider than the total sum of the channel widths of the second channels included in the plurality of second transistors.

In addition, as another aspect of the embodiment of the present invention, when a direction intersecting an extending direction of the common wire is set to a width direction, an area of a portion of the common wire which faces a region in which the plurality of second transistors are formed in the width direction may be smaller than an area of a portion of the common wire which faces a region in which the plurality of first transistors are formed in the width direction. An area of a portion of the common wire which faces a region in which the plurality of third transistors are formed in the width direction may be smaller than the area of the portion of the common wire which faces the region in which the plurality of second transistors are formed in the width direction.

In addition, as another aspect of the embodiment of the present invention, when a direction intersecting an extending direction of the common wire is set to a width direction, the plurality of second transistors may be arrayed in the extending direction and the width direction.

In addition, as another aspect of the embodiment of the present invention, the plurality of first transistors may be arrayed in the extending direction and the width direction.

In addition, as another aspect of the embodiment of the present invention, the transistor substrate may further include: a plurality of first transistor groups which are formed between the common wire and the first conductive wire and are connected to each other in parallel; and a plurality of second transistor groups which are formed between the common wire and the second conductive wire and are connected to each other in parallel. When a direction intersecting an extending direction of the common wire is set to a width direction, the plurality of first transistor groups may be arrayed in the extending direction, and the plurality of second transistor groups may be arrayed in the extending direction. Each of the plurality of first transistor groups may include the plurality of first transistors arrayed in the width direction, and each of the plurality of second transistor groups may include the plurality of second transistors arrayed in the width direction. A length of a portion of the common wire between the plurality of second transistor groups and the control circuit may be longer than a length of a portion of the common wire between the plurality of first transistor groups and the control circuit.

In addition, as another aspect of the embodiment of the present invention, the transistor substrate may further include: a fourth conductive wire formed to be spaced apart from the common wire; and a plurality of third transistor groups and a plurality of fourth transistor groups which are formed between the common wire and the fourth conductive wire and are connected to each other in parallel. The plurality of third transistor groups and the plurality of fourth transistor groups may be arrayed in the extending direction, each of the plurality of first transistor groups may include a first number of the first transistors arrayed in the width direction, where the first number is two or more, and each of the plurality of second transistor groups may include a second number of the second transistors arrayed in the width direction, where the second number is larger than the first number. Each of the plurality of third transistor groups may include the first number of fourth transistors arrayed in the width direction, and each of the plurality of fourth transistor groups may include the second number of the fourth transistors arrayed in the width direction. The fourth transistor may include: a fourth gate electrode; a fourth A electrode and a fourth B electrode which are formed on both sides of the fourth gate electrode to sandwich the fourth gate electrode; and a fourth channel facing the fourth gate electrode. The fourth A electrode may be connected to the fourth conductive wire, and the fourth B electrode may be connected to the common wire, in the fourth transistor. A length of a portion of the common wire between the plurality of third transistor groups and the plurality of fourth transistor groups, and the control circuit may be longer than the length of the portion of the common wire between the first transistor group and the control circuit. The length of the portion of the common wire between the plurality of third transistor groups and the plurality of fourth transistor groups, and the control circuit may be shorter than the length of the portion of the common wire between the second transistor group and the control circuit.

In addition, as another aspect of the embodiment of the present invention, the transistor substrate may further include a first common electrode and a second common electrode which are formed in the display region. The first common electrode may serve also as a first detection electrode which detects proximity or contact of an object, the second common electrode may serve also as a second detection electrode which detects proximity or contact of the object, the first common electrode may be electrically connected to the first conductive wire, and the second common electrode may be electrically connected to the second conductive wire.

In addition, as another aspect of the embodiment of the present invention, a display device may include the transistor substrate.

BRIEF DESCRIPTIONS OF THE DRAWINGS

FIG. 15 is a view schematically illustrating the configuration of the power supply wire and the switching unit in the display device according to a modification example of the embodiment; and FIG. 16 is a view schematically illustrating the configuration of the power supply wire and the switching unit in the display device according to the modification example of the embodiment.

DESCRIPTIONS OF THE PREFERRED EMBODIMENT

Figure 1:
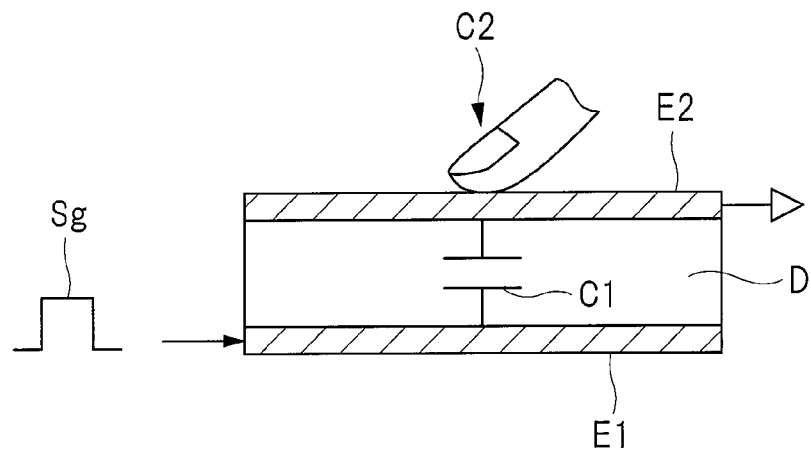
FIG. 1 is an explanatory diagram illustrating a state in which a finger is in contact or proximity with a touch detection device.

Hereinafter, an embodiment of the present invention will be described with reference to the drawings.

Note that this disclosure is an example only and suitable modifications which can be easily conceived by those skilled in the art without departing from the gist of the present invention are included within the scope of the invention as a matter of course. In addition, in order to further clarify the description, a width, a thickness, a shape, and the like of respective portions may be schematically illustrated in the drawings as compared to aspects of the embodiment, but they are examples only and do not limit the interpretation of the present invention.

In addition, in this specification and the respective drawings, the same components described in the drawings which have been described before are denoted by the same reference characters, and detailed description thereof may be omitted as needed.

Further, hatching which is applied in order to distinguish a structure is sometimes omitted in the drawings used in the embodiment depending on the drawing.

Embodiment

Hereinafter, a description will be given regarding an example in which a display device is applied to a touch detection function-equipped liquid crystal display device as an embodiment. Herein, the touch detection function-equipped liquid crystal display device is a liquid crystal display device in which a detection electrode for touch detection is provided in any one of an array substrate and a counter substrate included in the display device. In addition, a description will be further given in the embodiment regarding an in-cell type touch detection function-equipped liquid crystal display device having a characteristic that a drive electrode is provided to operate as a drive electrode of a touch panel.

<Principle of Electrostatic Capacitance Touch Detection>

Figure 2:
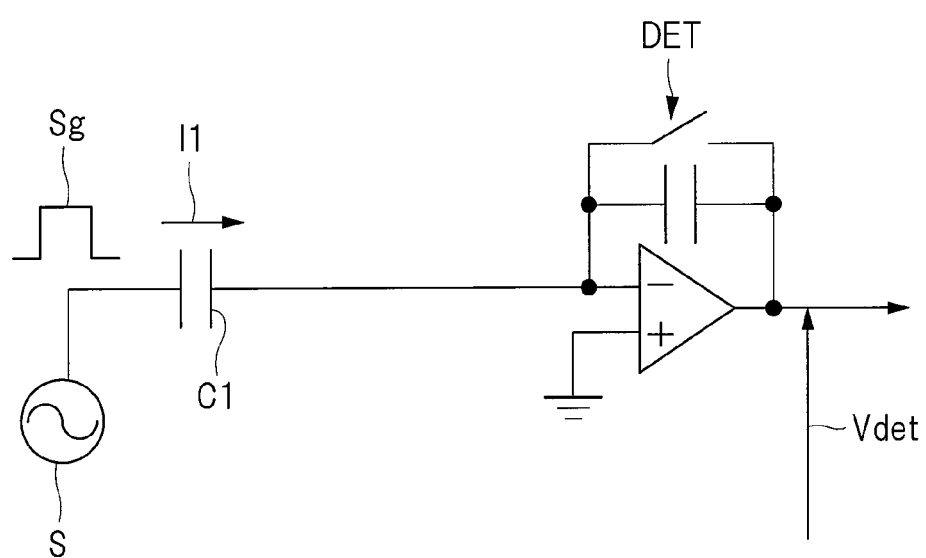
FIG. 2 is an explanatory diagram illustrating an example of an equivalent circuit in the state in which the finger is in contact or proximity with the touch detection device.

First, a description will be given regarding a principle of touch detection in a display device according to this embodiment with reference to FIGS. 1 and 2. FIG. 1 is an explanatory diagram illustrating a state in which a finger is in contact or proximity with a touch detection device. FIG. 2 is an explanatory diagram illustrating an example of an equivalent circuit in the state in which the finger is in contact or proximity with the touch detection device.

As illustrated in FIG. 1, an input device called a touch panel or a touch sensor includes a drive electrode E1 and a detection electrode E2 which are arranged to face each other with a dielectric material D sandwiched therebetween in the electrostatic capacitance touch detection. A capacitive element C1 is formed of the drive electrode E1 and the detection electrode E2. As illustrated in FIG. 2, one end of the capacitive element C1 is connected to an AC signal source S serving as a drive signal source, and the other end of the capacitive element C1 is connected to a voltage detector DET serving as a touch detection unit. The voltage detector DET is composed of, for example, an integration circuit.

When an AC square wave Sg having a frequency of about several kHz to several hundred kHz, for example, is applied to the one end of the capacitive element C1, that is, the drive electrode E1 from the AC signal source S, a detection signal Vdet serving as an output waveform is generated via the voltage detector DET connected to the other end of the capacitive element C1, that is, the detection electrode E2.

As illustrated in FIG. 2, a current I1 flows in a state in which a finger is not in contact or proximity, that is, in a non-contact state, depending on a capacitance value of the capacitive element C1 along with charge and discharge of the capacitive element C1. The voltage detector DET converts a variation in the current I1 depending on the AC square wave Sg into a variation in voltage.

In contrast, a capacitance value of the capacitive element C1 formed of the drive electrode E1 and the detection electrode E2 decreases as being affected by the electrostatic capacitance C2 formed by a finger in a state in which the finger is in contact or proximity, that is, in a contact state. Thus, the current I1 flowing in the capacitive element C1 illustrated in FIG. 2 varies. The voltage detector DET converts the variation of the current I1 depending on the AC square wave Sg into the variation of the voltage.

A differential voltage caused by the finger detected by the voltage detector DET serving as the touch detection unit is compared with a predetermined threshold voltage at the time of touch detection, and it is determined that an external proximity object approaching from the outside is in the contact state when the differential voltage is equal to or higher than the threshold voltage, and it is determined that the external proximity object is in the non-contact state when the differential voltage is lower than the threshold voltage.

Note that the above-described electrostatic capacitance system is a mutual capacitance system in which a variation in a capacitance which is formed between the drive electrode E1 and the detection electrode E2 is detected. Meanwhile, a self-capacitance system in which a variation in a capacitance which is formed between the drive electrode E1 and a ground electrode is detected may be applicable.

<Module>

Figure 3:
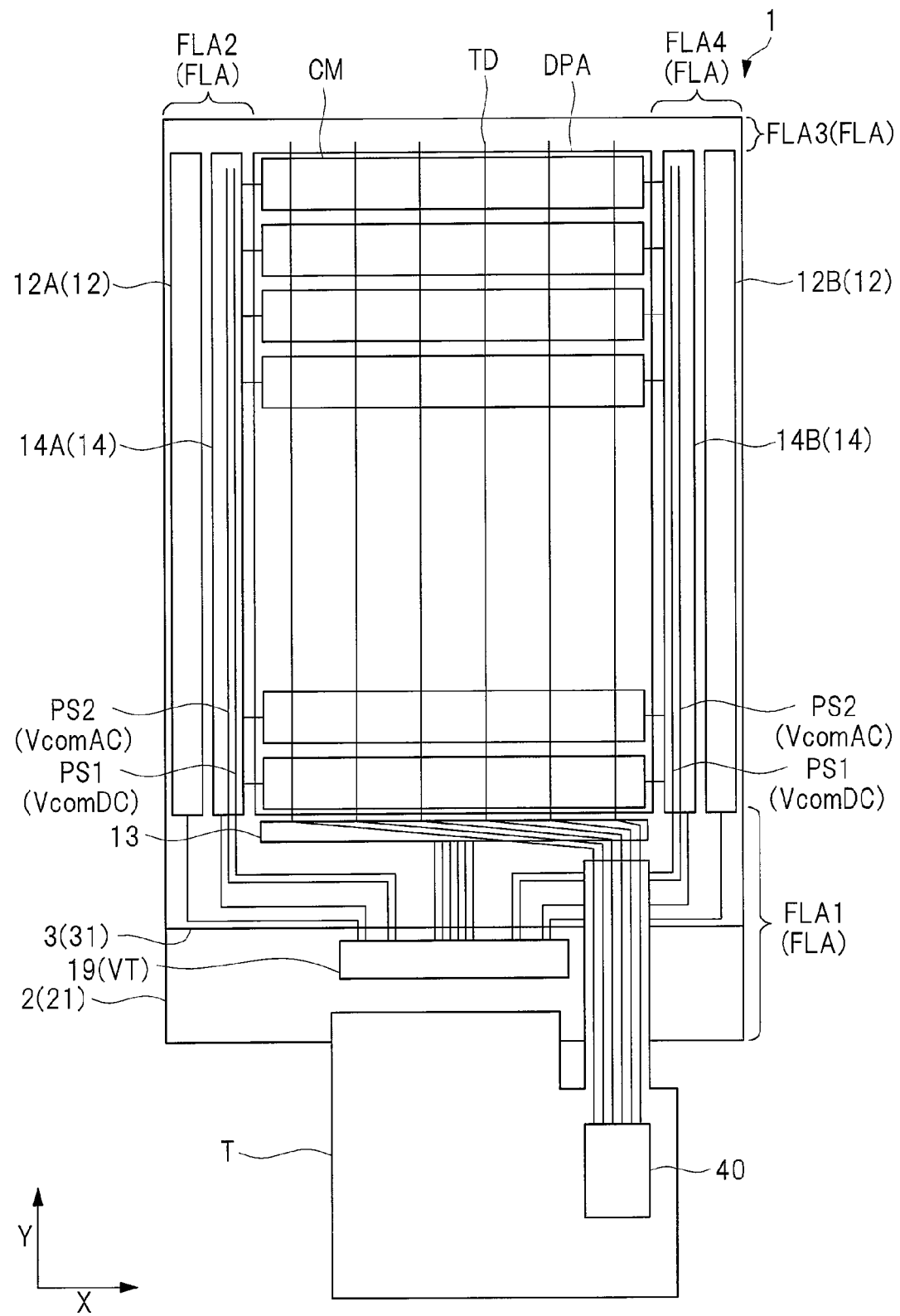
FIG. 3 is a plan view illustrating an example of a module to which a display device according to an embodiment is mounted.

FIG. 3 is a plan view illustrating an example of a module to which the display device according to the embodiment is mounted.

As illustrated in FIG. 3, a display device 1 includes an array substrate 2 serving as a transistor substrate including a base material 21, a counter substrate 3 including a base material 31, and a flexible printed board T.

The base material 21 includes a display region DPA and a frame region FLA. The display region DPA is a region on an upper surface 21a (see FIG. 4 to be described later) serving as a main surface of the base material 21 and is a region in which a plurality of sub-pixels Sx (see FIG. 5 to be described later) are provided. That is, the display region DPA is a region in which an image is displayed. The frame region FLA is a region on the upper surface 21a (see FIG. 4 to be described later) serving as the main surface of the base material 21 and is a region closer to an outer circumferential side of the base material 21 than the display region DPA. The frame region FLA is a region in which the image is not displayed.

Herein, two directions which intersect each other or preferably, are orthogonal to each other in the upper surface 21a serving as the main surface of the base material 21 are set to an X-axis direction and a Y-axis direction, respectively. In the example illustrated in FIG. 3, the base material 21 includes two sides each of which extends in the X-axis direction and two sides each of which extends in the Y-axis direction when seen in a plan view and has a rectangular shape. Thus, the frame region FLA is a frame-like region around the display region DPA in the example illustrated in FIG. 3.

In the specification of the present application, the expression, "when seen in a plan view" represents the case of being seen from a direction vertical to the upper surface 21a (see FIG. 4 to be described later) serving as the main surface of the base material 21. In addition, an expression "on the upper surface 21a serving as the main surface of the base material 21" will be sometimes referred to as simply as "on the base material 21," hereinafter.

In addition, an expression "positive side in the X-axis direction" in the specification of the present application represents a side toward which the arrow indicating the X-axis direction of the drawing extends, and an expression "negative side in the X-axis direction" represents the opposite side of the above-described "positive side." A positive side and a negative side in the Y-axis direction are used in the same manner.

Further, a direction in which an insulating film IF and a transistor Tr are stacked is set to "on" with respect to the base material 21 on which a pixel electrode is formed, and a direction on the opposite side of "on" is set to "below" unless otherwise particularly noted in the specification of the present application.

A chip on glass (COG) 19 serving as a control circuit is loaded on the base material 21. The COG 19 is an integrated circuit (IC) chip mounted to the base material 21 and is a control device in which each circuit required for a display operation is built.

A source driver 13 is provided on the base material 21. The source driver 13 may be built in the COG 19.

Gate drivers 12A and 12B serving as a gate driver 12 are provided on the base material 21. In addition, drive electrode drivers 14A and 14B serving as a drive electrode driver 14 are provided on the base material 21. The gate drivers 12A and 12B are provided in the frame region FLA.

Herein, a region of the frame region FLA which is arranged on the negative side in the Y-axis direction with respect to the display region DPA is set to a frame region FLA1, and a region of the frame region FLA which is arranged on the negative side in the X-axis direction with respect to the display region DPA is set to a frame region FLA2. In addition, a region of the frame region FLA which is arranged on the positive side in the Y-axis direction with respect to the display region DPA is set to a frame region FLA3, and a region of the frame region FLA which is arranged on the positive side in the X-axis direction with respect to the display region DPA is set to a frame region FLA4. In this case, the gate driver 12A and the drive electrode driver 14A are provided in the frame region FLA2, and the gate driver 12B and the drive electrode driver 14B are provided in the frame region FLA4.

As illustrated in FIG. 3, the display device 1 includes a plurality of drive electrodes CM and a plurality of detection electrodes TD. The plurality of drive electrodes CM and the plurality of detection electrodes TD are electrodes for touch detection, and an input position is detected based on an electrostatic capacitance between each of the plurality of drive electrodes CM and each of the plurality of detection electrodes TD. Each of the plurality of drive electrodes CM extends in the X-axis direction and is arrayed in the Y-axis direction in the display region DPA when seen in a plan view. In addition, each of the plurality of detection electrodes TD extends in the Y-axis direction and is arrayed in the X-axis direction when seen in a plan view.

A detection drive signal VcomAC serving as a drive signal for touch detection is supplied sequentially to each of the plurality of drive electrodes CM by the drive electrode driver 14 at the time of performing a touch detection operation. Each of the plurality of detection electrodes TD is connected to a touch detection unit 40 mounted to the flexible printed board T with the flexible printed board T sandwiched therebetween. The flexible printed board T may be a terminal without being limited to the flexible printed board. In such a case, the touch detection unit 40 is provided outside a module.

As will be described later with reference to FIG. 6, a large number of pixels Px composed of a plurality of sub-pixels Sx are arranged in a matrix form (in rows and columns) in the display region DPA. In addition, the gate driver 12A is provided in the frame region FLA2, and the gate driver 12B is provided in the frame region FLA4 as described above. The gate drivers 12A and 12B are provided such that the display region DPA which is the region in which the sub-pixels Sx (pixels) to be described later are arranged in the matrix form is sandwiched therebetween, and the gate drivers 12A and 12B drive the sub-pixel Sx from both the sides.

The drive electrode drivers 14A and 14B are connected to both sides of each of the plurality of drive electrodes CM arrayed in the Y-axis direction, on the positive side and the negative side in the X-axis direction. A display drive signal VcomDC serving as a drive signal for display is supplied to each of the plurality of drive electrodes CM in a switching manner from a drive signal generation circuit VT included in the COG 19, for example, via a power supply wire PS1 serving as a common wire based on the drive signal from the drive electrode drivers 14A and 14B. In addition, the detection drive signal VcomAC serving as the drive signal for touch detection is supplied to each of the plurality of drive electrodes CM. in a switching manner from the drive signal generation circuit VT via a power supply wire PS2 serving as the common wire based on the drive signal from the drive electrode drivers 14A and 14B.

That is, the display drive signal VcomDC is supplied to the power supply wire PS1 from the drive signal generation circuit VT serving as the control circuit, and the detection drive signal VcomAC is supplied to the power supply wire PS2 from the drive signal generation circuit VT. The power supply wire PS1 is formed in the frame regions FLA2 and FLA4 and extends in the Y-axis direction when seen in a plan view. The drive signal generation circuit VT is connected to one end of the power supply wire PS1. The power supply wire PS2 is provided in the frame regions FLA2 and FLA4 and extends in the Y-axis direction when seen in a plan view. The drive signal generation circuit VT is connected to one end of the power supply wire PS2.

Note that, although not illustrated in FIG. 3, a plurality of switching units SW are formed between the power supply wire PS2 and each of the plurality of drive electrodes CM as will be described later with reference to FIG. 9. In addition, the plurality of switching units SW may be formed between the power supply wire PS1 and each of the plurality of drive electrodes CM.

<Display Device>

Figure 4:
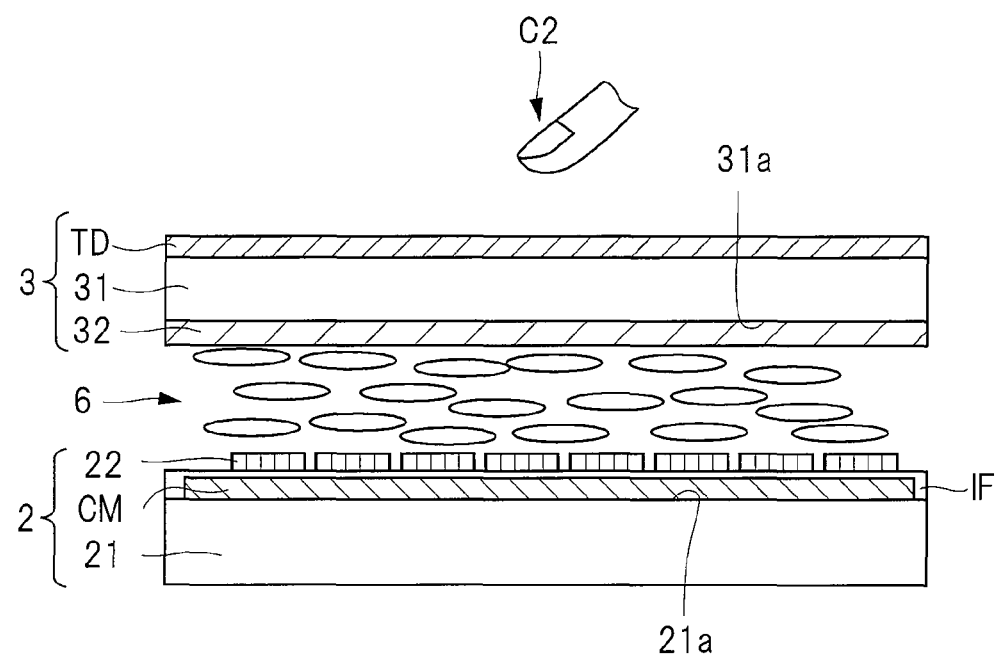
FIG. 4 is a cross-sectional view illustrating the display device according to the embodiment.
Figure 5:
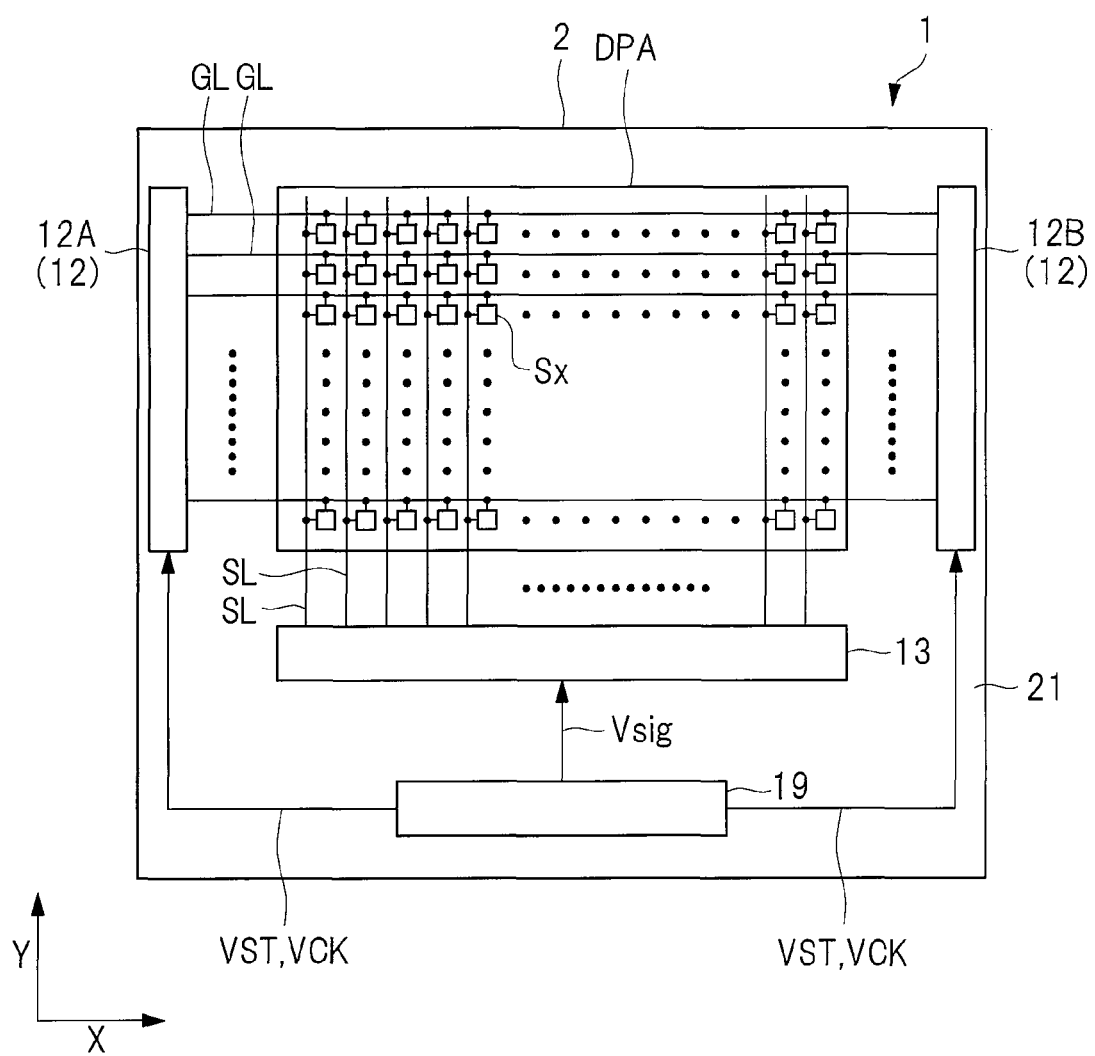
FIG. 5 is a circuit block diagram illustrating the display device according to the embodiment.

Next, a configuration example of the display device according to the embodiment will be described in detail with reference to FIGS. 3 and 4 to 6. FIG. 4 is a cross-sectional view illustrating the display device according to the embodiment. FIG. 5 is a circuit block diagram illustrating the display device according to the embodiment. FIG. 6 is a circuit diagram illustrating the display device according to the embodiment.

As illustrated in FIG. 4, the display device 1 (see FIG. 3) includes the array substrate 2, the counter substrate 3, and a liquid crystal layer 6. The counter substrate 3 is arranged to face the array substrate 2 such that an upper surface of the array substrate 2 and a lower surface of the counter substrate 3 face each other. The liquid crystal layer 6 is provided between the array substrate 2 and the counter substrate 3.

The array substrate 2 includes the base material 21 having an insulating property. In addition, the counter substrate 3 includes the base material 31 having an insulating property. The base material 31 has an upper surface and a lower surface on the opposite side of the upper surface and is arranged at a position facing the base material 21 such that the upper surface of the base material 21 and the lower surface of the base material 31 face each other. In addition, the liquid crystal layer 6 is sandwiched between the upper surface of the base material 21 and the lower surface of the base material 31. Note that, as described above, the upper surface of the base material 21 is referred to as an upper surface 21*a*. In addition, the lower surface of the base material 31 is referred to as a lower surface 31*a*.

In addition, the array substrate 2 includes the display region DPA, the COG 19, the gate drivers 12A and 12B, and the source driver 13 on the base material 21 as illustrated in FIG. 5.

Figure 6:
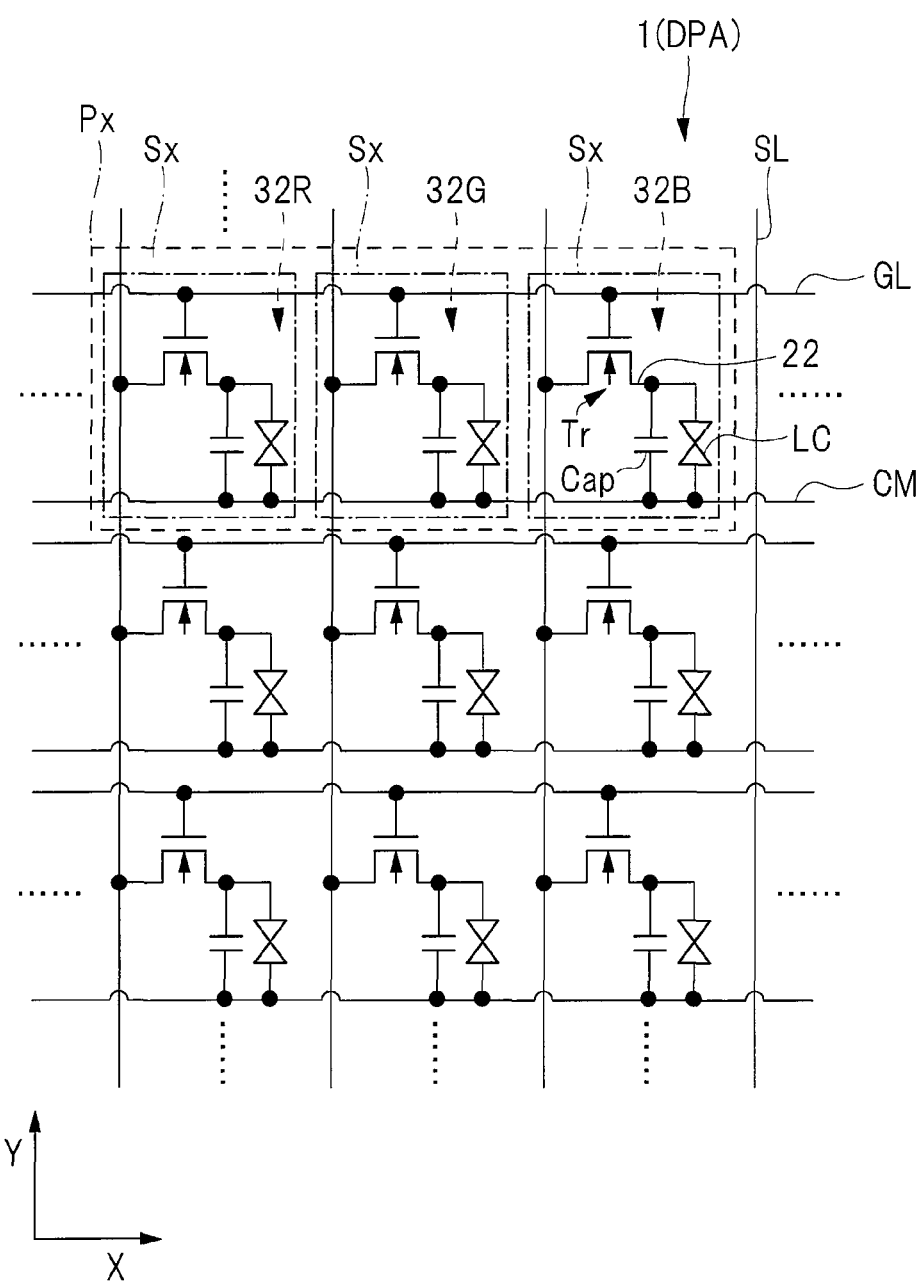
FIG. 6 is a circuit diagram illustrating the display device according to the embodiment.

As illustrated in FIGS. 5 and 6, the sub-pixels Sx are arrayed in the matrix form (in rows and columns) in the display region DPA. In addition, a single pixel Px is formed of a plurality of sub-pixels Sx having different colors as illustrated in FIG. 6.

Note that the row means a row of pixels including the plurality of sub-pixels Sx arrayed in the X-axis direction in the specification of the present application. In addition, the column means a column of pixels including the plurality of sub-pixels Sx arrayed in the Y-axis direction which intersects, or preferably, is orthogonal to the array direction of rows.

As illustrated in FIG. 5, each of the plurality of scan lines GL extends in the X-axis direction and is arrayed in the Y-axis direction in the display region DPA. Each of the plurality of signal lines SL extends in the Y-axis direction and is arrayed in the X-axis direction in the display region DPA. Accordingly, each of the plurality of signal lines SL intersects the plurality of scan lines GL when seen in a plan view. In this manner, the sub-pixel Sx is arranged at each intersection between the plurality of scan lines GL and the plurality of signal lines SL which intersect each other, when seen in a plan view.

A master clock signal, a horizontal synchronization signal, and a vertical synchronization signal are input to the COG 19 from the outside of the array substrate 2. The COG 19 generates a vertical start pulse VST and a vertical clock pulse VCK based on the master clock signal, the horizontal synchronization signal, and the vertical synchronization signal which are input to the COG 19, and supplies the generated pulses to the gate drivers 12A and 12B.

The gate drivers 12A and 12B sequentially output and supply scan signals based on the input vertical start pulse VST and the input vertical clock pulse VCK to the scan line GL, thereby sequentially selecting the sub-pixels Sx row by row.

Image signals Vsig of red, green, and blue, for example, are provided to the source driver 13. The source driver 13 supplies through the signal line SL, the pixel signal to each of the sub-pixels Sx of the row selected by the gate drivers 12A and 12B for each one pixel or a plurality of pixels.

As illustrated in FIG. 6, the transistor Tr composed of a thin film transistor (TFT) and serving as a field-effect transistor is formed at an intersecting portion at which each of the plurality of scan lines GL and each of the plurality of signal lines SL intersect each other when seen in a plan view. Accordingly, the plurality of transistors Tr are formed on the base material 21 in the display region DPA, and the plurality of transistors Tr are arrayed in a matrix form in the X-axis direction and the Y-axis direction. That is, the transistor Tr is provided in each of the plurality of sub-pixels Sx. In addition, a pixel electrode 22 as well as the transistor Tr is provided in each of the plurality of sub-pixels Sx.

The transistor Tr is composed of the thin film transistor serving as, for example, an n-channel metal oxide semiconductor (MOS). A gate electrode of the transistor Tr is connected to the scan line GL. One of a source electrode and a drain electrode of the transistor Tr is connected to the signal line SL or is the signal line SL. The other of the source electrode and the drain electrode of the transistor Tr is connected to the pixel electrode 22.

As illustrated in FIG. 4, the array substrate 2 includes the base material 21, the drive electrode CM serving as the common electrode, the insulating film IF, and the plurality of pixel electrodes 22. The drive electrode CM is provided on the upper surface 21*a* of the base material 21 inside the display region DPA when seen in a plan view. The insulating film IF is formed on the upper surface 21*a* of the base material 21 including a surface of the drive electrode CM. The plurality of pixel electrodes 22 are formed on the insulating film IF in the display region DPA. Accordingly, the insulating film IF electrically insulates the drive electrode CM from the pixel electrode 22.

Note that the array substrate 2 is a transistor substrate which includes the display region DPA in which the sub-pixel Sx is formed and the frame region FLA serving as a peripheral region positioned outside the display region DPA.

As illustrated in FIG. 6, each of the plurality of pixel electrodes 22 is formed inside each of the plurality of sub-pixels Sx arrayed in the matrix form in the X-axis direction and the Y-axis direction inside the display region DPA when seen in a plan view. Accordingly, the plurality of pixel electrodes 22 are arrayed in a matrix form in the X-axis direction and the Y-axis direction.

In the example illustrated in FIG. 4, the drive electrode CM is formed between the base material 21 and the pixel electrode 22. In addition, the drive electrode CM is provided so as to overlap each of the plurality of pixel electrodes 22 and is superimposed on the scan line GL (see FIG. 6) when seen in a plan view. Further, a voltage is applied between each of the plurality of pixel electrodes 22 and the drive electrode CM, and an electric field is formed between each of the plurality of pixel electrodes 22 and the drive electrode CM, that is, at each of the plurality of sub-pixels Sx. Accordingly, liquid crystals in the liquid crystal layer 6 are aligned, and an image is displayed in the display region DPA. At this time, a capacitance Cap is formed between the drive electrode CM and the pixel electrode 22, and the capacitance Cap functions as a retention capacitor.

Note that the drive electrode CM may be formed closer to the liquid crystal layer 6 side than the pixel electrode 22. Further, the drive electrode CM may be formed in the base material 31. In addition, the arrangement of the drive electrode CM and the pixel electrode 22 is set to an arrangement in a fringe field switching (FFS) mode serving as a horizontal electric field mode in which the drive electrode CM and the pixel electrode 22 overlap each other in a plan view in the example illustrated in FIG. 4. However, the arrangement of the drive electrode CM and the pixel electrode 22 may be set to an arrangement in an in-plane switching (IPS) mode serving as the horizontal electric field mode in which the drive electrode CM and the pixel electrode 22 do not overlap each other in a plan view. Alternatively, the arrangement of the drive electrode CM and the pixel electrode 22 may be set to an arrangement in a twisted nematic (TN) mode or a vertical alignment (VA) mode serving as a vertical electric field mode, for example.

The liquid crystal layer 6 is configured to modulate light passing therethrough depending on a state of an electric field, and for example, a liquid crystal layer corresponding to the horizontal electric field mode such as the FFS mode or the IPS mode described above is used as the liquid crystal layer 6. Note that alignment films may be provided between the liquid crystal layer 6 and the array substrate 2 and between the liquid crystal layer 6 and the counter substrate 3, illustrated in FIG. 4.

The gate drivers 12A and 12B sequentially select one row (one horizontal line) of the sub-pixels Sx, arranged in the matrix form in the display region DPA, as a display drive target by supplying the scan signal to a gate of the transistor Tr of the sub-pixel Sx via the scan line GL. The source driver 13 supplies the pixel signal to each of the sub-pixels Sx included in the one horizontal line sequentially selected by the gate drivers 12A and 12B via the signal line SL. Further, the display operation for the one horizontal line is performed according to the supplied pixel signal in these sub-pixels Sx. The drive electrode drivers 14A and 14B serving as the drive electrode driver 14 supply the display drive signal VcomDC to drive the drive electrode CM at the time of performing the display operation.

The drive electrode CM of the display device 1 according to the embodiment operates as a drive electrode of the liquid crystal display device and operates as a drive electrode of the touch detection device.

As illustrated in FIGS. 3 and 4, the display device according to the embodiment includes the plurality of drive electrodes CM provided in the array substrate 2 and the plurality of detection electrodes TD provided in the counter substrate 3. Each of the plurality of detection electrodes TD extends in a direction intersecting the direction in which each of the plurality of drive electrodes CM extends when seen in a plan view.

Each of the plurality of detection electrodes TD is connected to the touch detection unit 40. An electrostatic capacitance is generated at each intersecting portion between each of the plurality of drive electrodes CM and each of the plurality of detection electrodes TD in a plan view. An input position is detected based on the electrostatic capacitance between each of the plurality of drive electrodes CM and each of the plurality of detection electrodes TD.

When the touch detection unit 40 performs the touch detection operation, for example, one or the plurality of drive electrodes CM are sequentially selected along a scan direction (the Y-axis direction) by the drive electrode driver 14. Further, the detection drive signal VcomAC is supplied and input to the selected one or plurality of drive electrodes CM, and the detection signal Vdet for detection of the input position is generated and output from the detection electrode TD. The one or plurality of drive electrodes CM included in a single drive range correspond to the drive electrode E1 in the above-described principle of the touch detection, and the detection electrode TD corresponds to the detection electrode E2.

When seen in a plan view, the plurality of drive electrodes CM. and the plurality of detection electrodes TD intersecting each other form electrostatic capacitance touch sensors arrayed in a matrix form. Accordingly, it is possible to detect a position at which a finger is in contact or proximity by scanning an entire touch detection surface.

As illustrated in FIG. 4, the counter substrate 3 includes the base material 31 and a color filter 32. The color filter 32 is formed on the lower surface 31a of the base material 31.

Color filters, colored in three colors of, for example, R (red), G (green), and B (blue), are arrayed in the X-axis direction as the color filter 32. Accordingly, the plurality of sub-pixels Sx each of which corresponds to each of color regions 32R, 32G, and 32B of the three colors including red, green, and blue are formed, and the single pixel Px is formed of the plurality of sub-pixels Sx each of which corresponds to each set of the color regions 32R, 32G, and 32B as illustrated in FIG. 6. The sub-pixels Sx of the respective colors of red, green, and blue display the respective colors of red, green, and blue.

A plurality of colors including colors other than red, green, and blue may be used in combination as combinations of colors of the color filter 32. In addition, one of the pixels Px may include the sub-pixel Sx in which the color filter 32 is not provided, that is, the sub-pixel Sx of W (white) to display white color. Alternatively, the color filter may be provided in the array substrate 2 using the color filter on array (COA) technique.

Note that a polarization plate (not illustrated) may be provided below the array substrate 2, and a polarization plate (not illustrated) may be provided above the counter substrate 3.

<Configuration of Power Supply Wire and Switching Unit>

Figure 7:
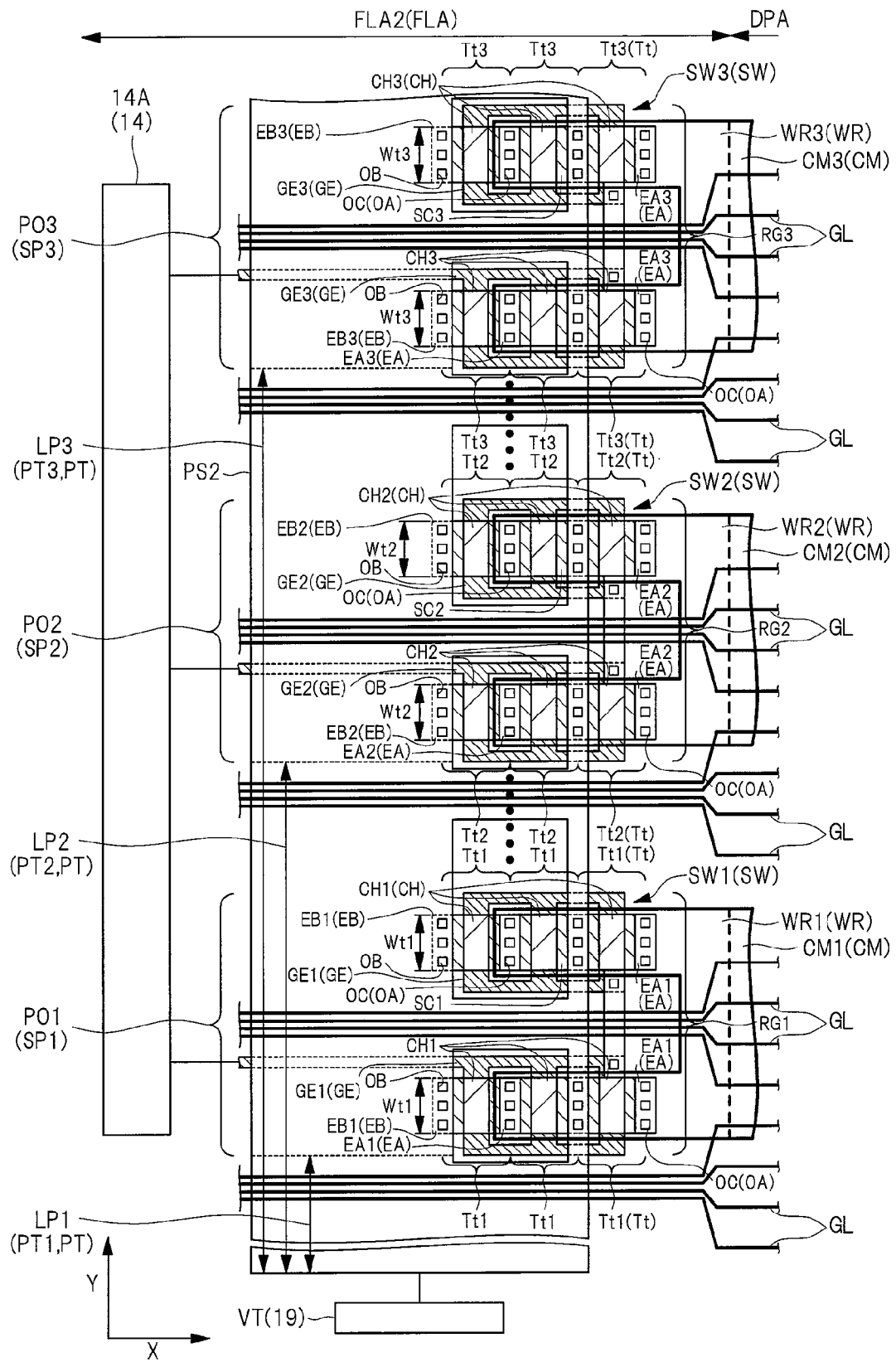
FIG. 7 is a plan view of a power supply wire and a switching unit in a display device according to a comparative example.
Figure 8:
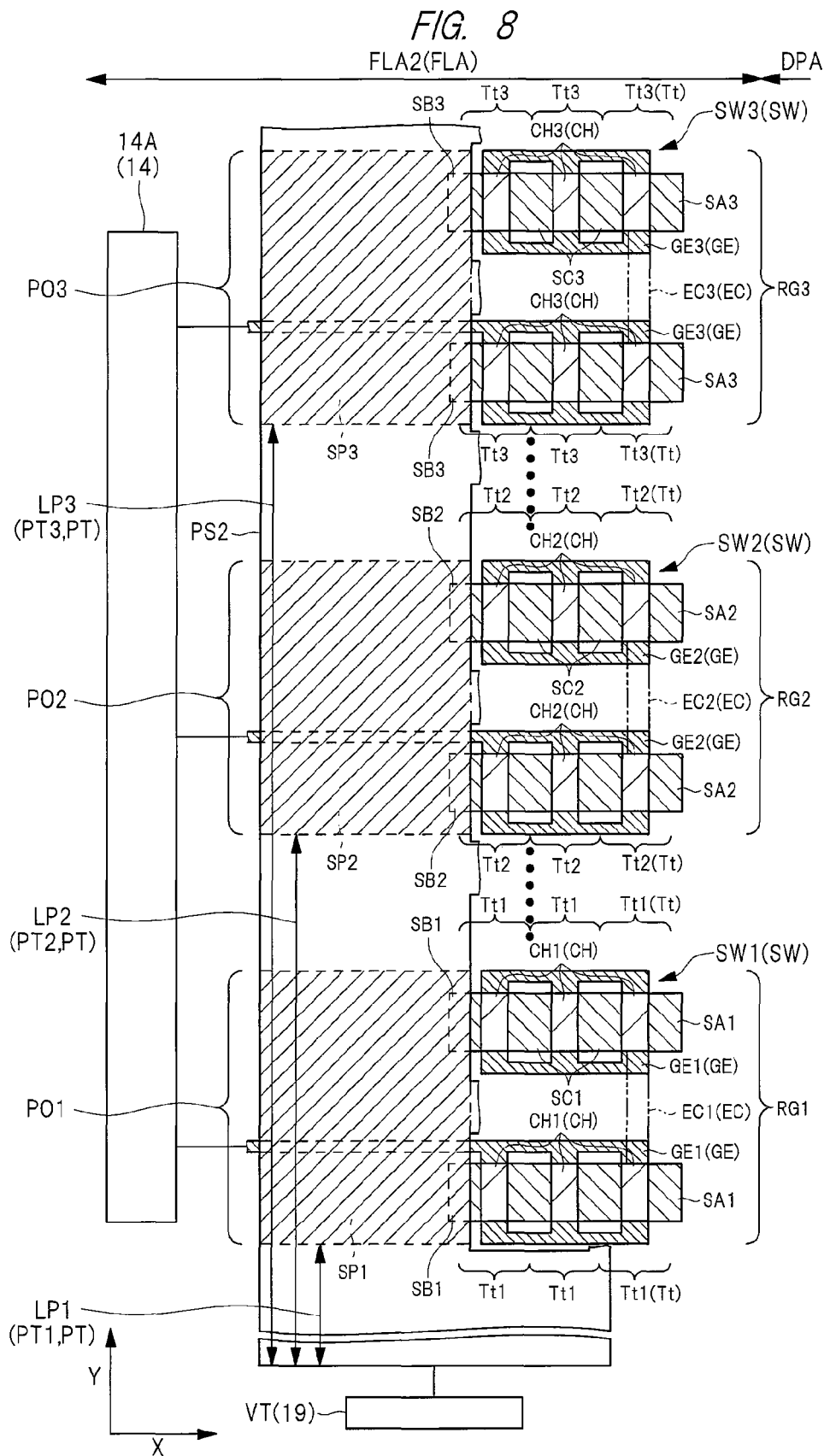
FIG. 8 is a plan view of the power supply wire and the switching unit in the display device according to the comparative example.
Figure 11:
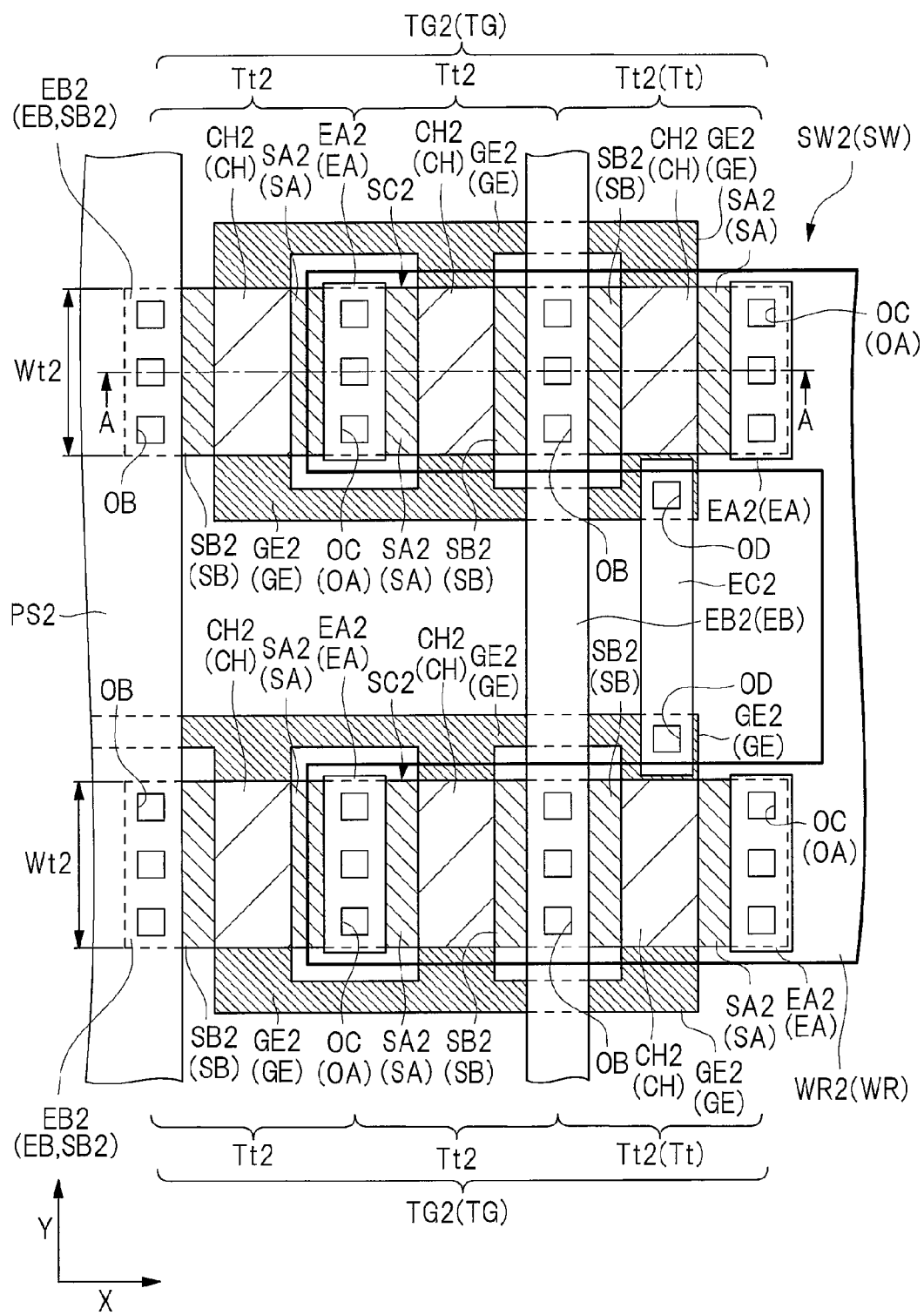
FIG. 11 is a plan view of the switching unit in the display device according to the embodiment.
Figure 12:
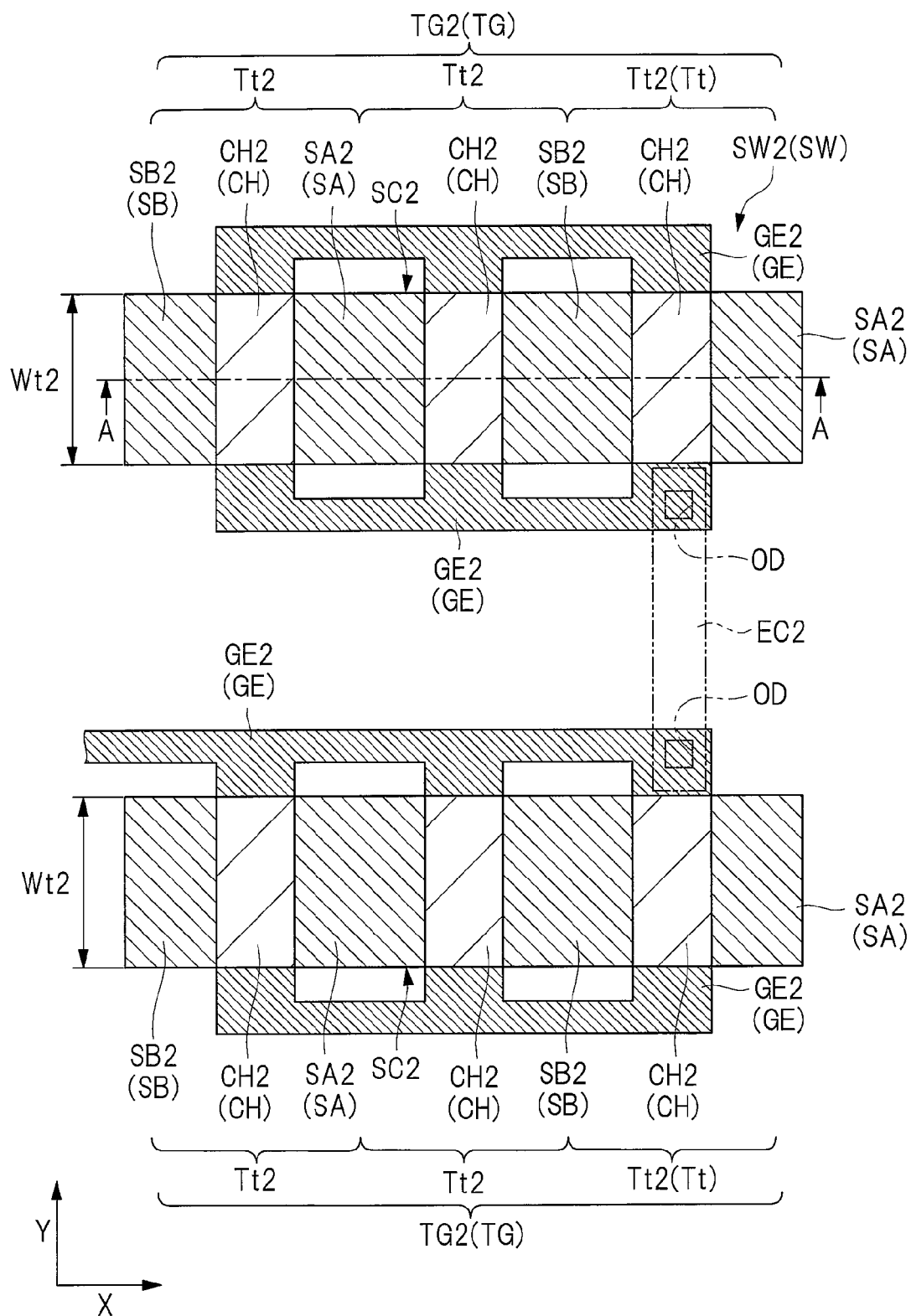
FIG. 12 is a plan view of the switching unit in the display device according to the embodiment.
Figure 13:
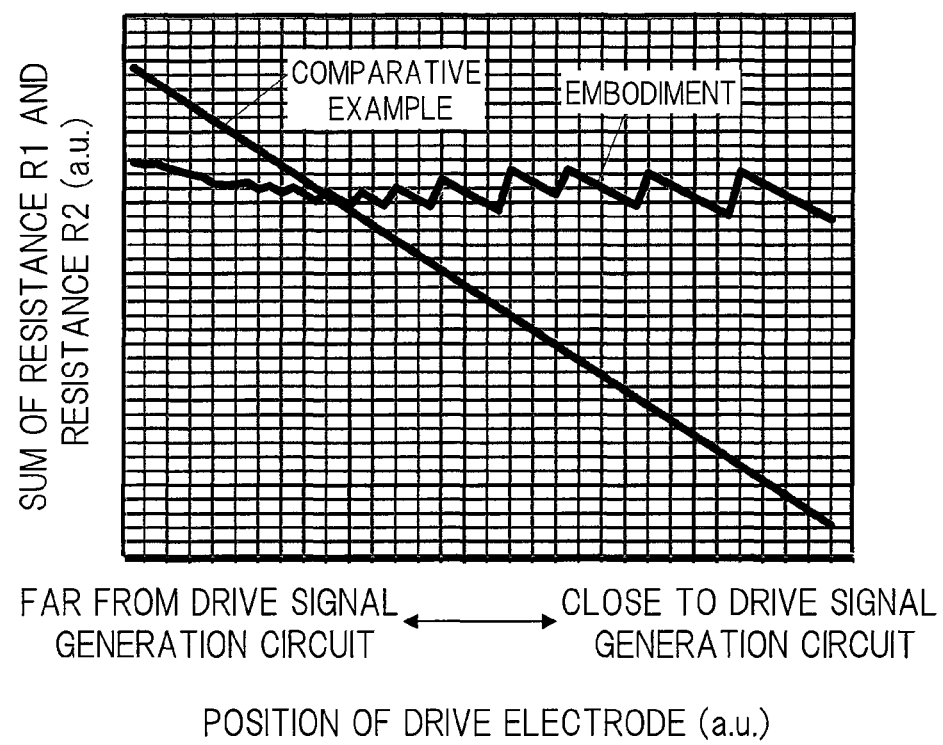
FIG. 13 is a graph schematically illustrating positional dependence of a sum between a resistance of the switching unit and a resistance of the power supply wire in a drive electrode.

Next, the configuration of the power supply wire and the switching unit will be described while comparing the embodiment and a comparative example. FIGS. 7 and 8 are plan views of a power supply wire and a switching unit in a display device according to the comparative example. FIGS. 9 and 10 are plan views of a power supply wire and a switching unit in the display device according to the embodiment. FIGS. 11 and 12 are plan views of the switching unit in the display device according to the embodiment. FIG. 13 is a graph schematically illustrating positional dependence of a sum between a resistance of the switching unit and a resistance of the power supply wire in the drive electrode.

FIG. 8 does not illustrate the scan line GL, a conductive wire WR, the drive electrode CM, electrodes EA and EB, and opening portions OA, OB, and OC in FIG. 7 for viewability. FIG. 10 does not illustrate the scan line GL, the conductive wire WR, the drive electrode CM, the electrodes EA and EB, and the opening portions OA, OB, and OC in FIG. 9 for viewability. FIG. 11 illustrates the vicinity of a switching unit SW2 in FIG. 9 in an enlarged manner. In addition, FIG. 12 illustrates the vicinity of the switching unit SW2 in FIG. 10 in an enlarged manner. Note that the switching unit SW2 in FIG. 11 is the same as the switching unit SW2 in the drawing illustrating the vicinity of the switching unit SW2 in FIG. 7 in an enlarged manner. In addition, FIG. 12 is the same as the drawing illustrating the vicinity of the switching unit SW2 in FIG. 8 in an enlarged manner.

First, a description will be given regarding a portion of a display device according to the comparative example which is the same as the display device according to the embodiment. In other words, the description will be given regarding the same portion of the display device according to the embodiment as the display device according to the comparative example.

As illustrated in FIGS. 7 to 10, the display device includes the plurality of switching units SW and a plurality of the conductive wires WR both in the comparative example and the embodiment. In addition, FIGS. 11 and 12 illustrate the switching unit SW2 as the switching unit SW in an enlarged manner.

The plurality of switching units SW, for example, are formed in the base material 21 (see FIG. 3). Each of the plurality of switching units SW is formed to correspond to each of the plurality of drive electrodes CM. The plurality of switching units SW are the circuits that supply the detection drive signal VcomAC (see FIG. 3) from the power supply wire PS2 to each of the plurality of drive electrodes CM in a switching manner based on the drive signal from the drive electrode driver 14. The drive electrode driver 14 includes, for example, a shift register circuit.

Note that the plurality of switching units SW may be circuits that supply the display drive signal VcomDC (see FIG. 3) to each of the plurality of drive electrodes CM in a switching manner based on the drive signal from the drive electrode driver 14 although the description thereof will be omitted hereinafter. Further, the plurality of switching units SW may be circuits that selectively supply the display drive signal VcomDC and the detection drive signal VcomAC to each of the plurality of drive electrodes CM in a switching manner based on the drive signal from the drive electrode driver 14.

Each of the plurality of conductive wires WR is formed between the switching unit SW and the drive electrode CM in the set of the switching unit SW and the drive electrode CM. Thus, the switching unit SW is arranged between the power supply wire PS2 and the conductive wire WR in the frame region FLA2. In addition, each of the plurality of conductive wires WR is formed to be spaced apart from the power supply wire PS2.

Each of the plurality of switching units SW causes the power supply wire PS2 to be connected to each of the plurality of conductive wires WR in a switching manner. In addition, each of the plurality of conductive wires WR is electrically connected to each of the plurality of drive electrodes CM. Accordingly, each of the plurality of switching units SW causes the power supply wire PS2 to be connected to each of the plurality of drive electrodes CM in a switching manner. Further, an input position is detected when the detection drive signal VcomAC (see FIG. 3) is supplied to each of the plurality of drive electrodes CM in a switching manner by the plurality of switching units SW.

Note that an image is displayed using the plurality of sub-pixels Sx (see FIG. 6) when the display drive signal VcomDC (see FIG. 3) is supplied to each of the plurality of drive electrodes CM by the plurality of switching units SW in a switching manner.

Further, the drive electrode CM serving as the common electrode also serves as the drive electrode for display and the detection electrode that detects proximity or contact of the object when the plurality of switching units SW selectively supply the display drive signal VcomDC and the detection drive signal VcomAC to each of the plurality of drive electrodes CM in a switching manner based on the drive signal from the drive electrode driver 14.

The plurality of switching units SW are arrayed in the Y-axis direction when seen in a plan view. Each of the plurality of switching units SW is provided to correspond to each of the plurality of drive electrodes CM on a one-to-one basis. Each of the plurality of switching units SW includes a plurality of transistors Tt serving as a switching element. Preferably, each of the plurality of transistors Tt may be an n-channel field-effect transistor or a p-channel field-effect transistor. In addition, the plurality of transistors Tt may be thin film transistors.

The plurality of transistors Tt are connected to each other in parallel between the power supply wire PS2 and the drive electrode CM in the set of the switching unit SW and the drive electrode CM.

The plurality of switching units SW are set as switching units SW1, SW2, and SW3, and the plurality of drive electrodes CM are set as drive electrodes CM1, CM2, and CM3. At this time, the switching unit SW1 is provided between the power supply wire PS2 and the drive electrode (first common electrode) CM1, the switching unit SW2 is provided between the power supply wire PS2 and the drive electrode (second common electrode) CM2, and the switching unit SW3 is provided between the power supply wire PS2 and the drive electrode (third common electrode) CM3. Further, the drive electrode CM1 serves also as a first detection electrode that detects proximity or contact of the object, the drive electrode CM2 serves also as a second detection electrode that detects proximity or contact of the object, and the drive electrode CM3 serves also as a third detection electrode that detects proximity or contact of the object.

The switching unit SW1 includes a plurality of transistors (first transistors) Tt1 serving as the transistor Tt. The plurality of transistors Tt1 are connected to each other in parallel between the power supply wire PS2 and the drive electrode CM1. The switching unit SW2 includes a plurality of transistors (second transistors) Tt2 serving as the transistor Tt. The plurality of transistors Tt2 are connected to each other in parallel between the power supply wire PS2 and the drive electrode CM2. The switching unit SW3 includes a plurality of transistors (third transistors) Tt3 serving as the transistor Tt. The plurality of transistors Tt3 are connected to each other in parallel between the power supply wire PS2 and the drive electrode CM3.

Note that a detailed structure of each of the plurality of transistors Tt will be described later.

As illustrated in FIGS. 7 to 10, a length LP2 of a portion PT2 of the power supply wire PS2 between the plurality of transistors Tt2 and the drive signal generation circuit VT is longer than a length LP1 of a portion PT1 of the power supply wire PS2 between the plurality of transistors Tt1 and the drive signal generation circuit VT. In addition, a length LP3 of a portion PT3 of the power supply wire PS2 between the plurality of transistors Tt3 and the drive signal generation circuit VT is longer than the length LP2 of the portion PT2 of the power supply wire PS2 between the plurality of transistors Tt2 and the drive signal generation circuit VT.

Next, a description will be given regarding a portion of the display device according to the comparative example, which is different from the display device according to the embodiment, and a problem in the display device according to the comparative example.

As illustrated in FIGS. 7 and 8, the number of the plurality of transistors Tt2 included in the switching unit SW2 is equal to the number of the plurality of transistors Tt1 included in the switching unit SW1 in the display device according to the comparative example. In addition, the number of the plurality of transistors Tt3 included in the switching unit SW3 is equal to the number of the plurality of transistors Tt2 included in the switching unit SW2. FIGS. 7 and 8 illustrate an example in which the six transistors Tt are included in any of the switching units SW1, SW2, and SW3. Note that the number of transistors in the invention of the present application is set based on the number of channels.

That is, a total sum of channel widths Wt2 of channels CH2 included in the plurality of transistors Tt2 of the switching unit SW2 is equal to a total sum of channel widths Wt1 of channels CH1 included in the plurality of transistors Tt1 of the switching unit SW1. In addition, a total sum of channel widths Wt3 of channels CH3 included in the plurality of transistors Tt3 of the switching unit SW3 is equal to the total sum of the channel widths Wt2 of the channels CH2 included in the plurality of transistors Tt2 of the switching unit SW2. Note that the channel CH is a portion of a semiconductor layer SC (see FIG. 14 to be described later) which faces a gate electrode GE.

An extending direction of the power supply wire PS2, that is, a direction intersecting the Y-axis direction is a width direction of the power supply wire PS2, that is, the X-axis direction. In such a case, an area SP2 of a portion PO2 (see FIG. 8) of the power supply wire PS2, which faces a region RG2 in which the plurality of transistors Tt2 are formed in the X-axis direction, is equal to an area SP1 of a portion PO1 (see FIG. 8) of the power supply wire PS2, which faces a region RG1 in which the plurality of transistors Tt1 are formed in the X-axis direction, in the display device according to the comparative example. In addition, an area SP3 of a portion PO3 (see FIG. 8) of the power supply wire PS2, which faces a region RG3 in which the plurality of transistors Tt3 are formed in the X-axis direction, is equal to the area SP2 of the portion PO2 (see FIG. 8). Note that each of the portions PO1, PO2, and PO3 is illustrated with hatching in FIG. 8.

Here, a time constant $\tau$ at the time when a signal having a rectangular shape, for example, is input to the drive electrode CM is proportional to a sum of two resistances R1 and R2 to be described later. The resistance R1 is a resistance of the switching unit SW which is connected between each of the plurality of drive electrodes CM and the power supply wire PS2, in an ON-state. Meanwhile, the resistance R2 is a resistance of the portion PT of the power supply wire PS2 between the switching unit SW and the drive signal generation circuit VT.

In the display device according to the comparative example, the resistance R1 is equal among the plurality of drive electrodes CM. In contrast, the resistance R2 becomes larger in the drive electrode CM farther from the drive signal generation circuit VT. Thus, the sum of the resistance R1 and the resistance R2 becomes larger in the drive electrode CM farther from the drive signal generation circuit VT and becomes smaller in the drive electrode CM closer to the drive signal generation circuit VT, in the display device according to the comparative example as illustrated in FIG. 13. Further, since the time constant $\tau$ at the time when the signal having the rectangular shape, for example, is input to the drive electrode CM is proportional to the sum of the resistance R1 and the resistance R2, the time constant $\tau$ becomes larger in the drive electrode CM farther from the drive signal generation circuit VT and becomes smaller in the drive electrode CM closer to the drive signal generation circuit VT.

The drive electrode CM having the largest time constant $\tau$ among the plurality of drive electrodes CM has the greatest influence on the touch detection property. Thus, the drive electrode CM close to the drive signal generation circuit VT has a little influence on the touch detection property, and the drive electrode CM far from the drive signal generation circuit VT has great influence on the touch detection property, in the display device according to the comparative example. That is, there is a risk that the touch detection property of the display device deteriorates as the sum of the resistance R1 and the resistance R2 is large in the drive electrode CM far from the drive signal generation circuit VT in the display device according to the comparative example.

Note that there is a risk that a display property of the display device deteriorates as the sum of the resistance R1 and the resistance R2 is large in the drive electrode CM far from the drive signal generation circuit VT in the case of using each of the plurality of drive electrodes CM as the common electrode for display.

A technical idea of the display device according to the embodiment can solve such problems of the display device according to the comparative example, and an object thereof is to reduce the time constant $\tau$ at the time when a signal is input to the drive electrode CM far from the drive signal generation circuit VT serving as the control circuit. Next, the configuration of the power supply wire and the switching unit according to the display device of the embodiment will be described. The same portion of the display device according to the embodiment as the display device according to the comparative example have been described already, and thus, a description will be given by focusing on a portion of the display device according to the embodiment different from the display device according to the comparative example, hereinafter.

Figure 9:
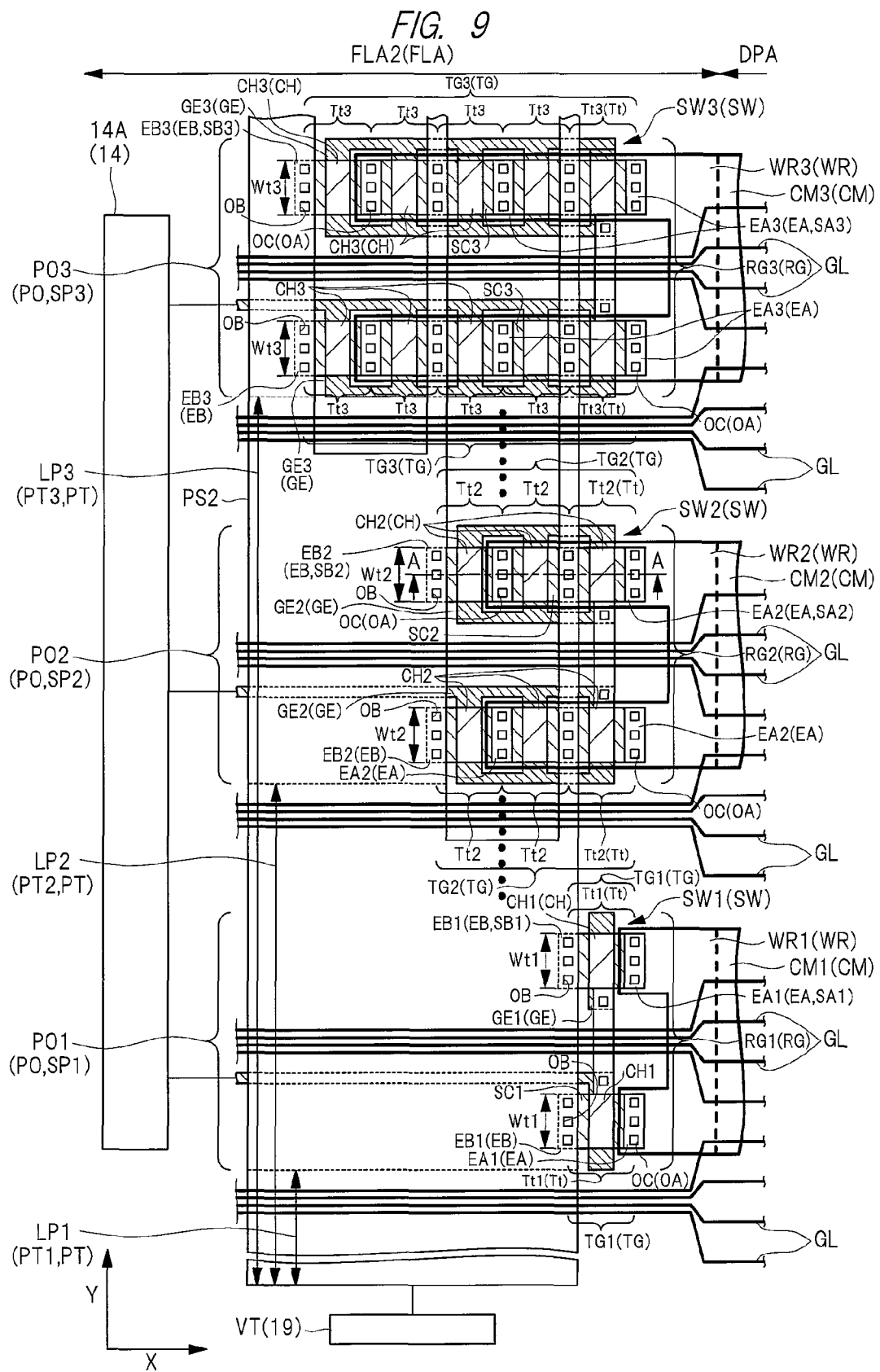
FIG. 9 is a plan view of a power supply wire and a switching unit in the display device according to the embodiment.
Figure 10:
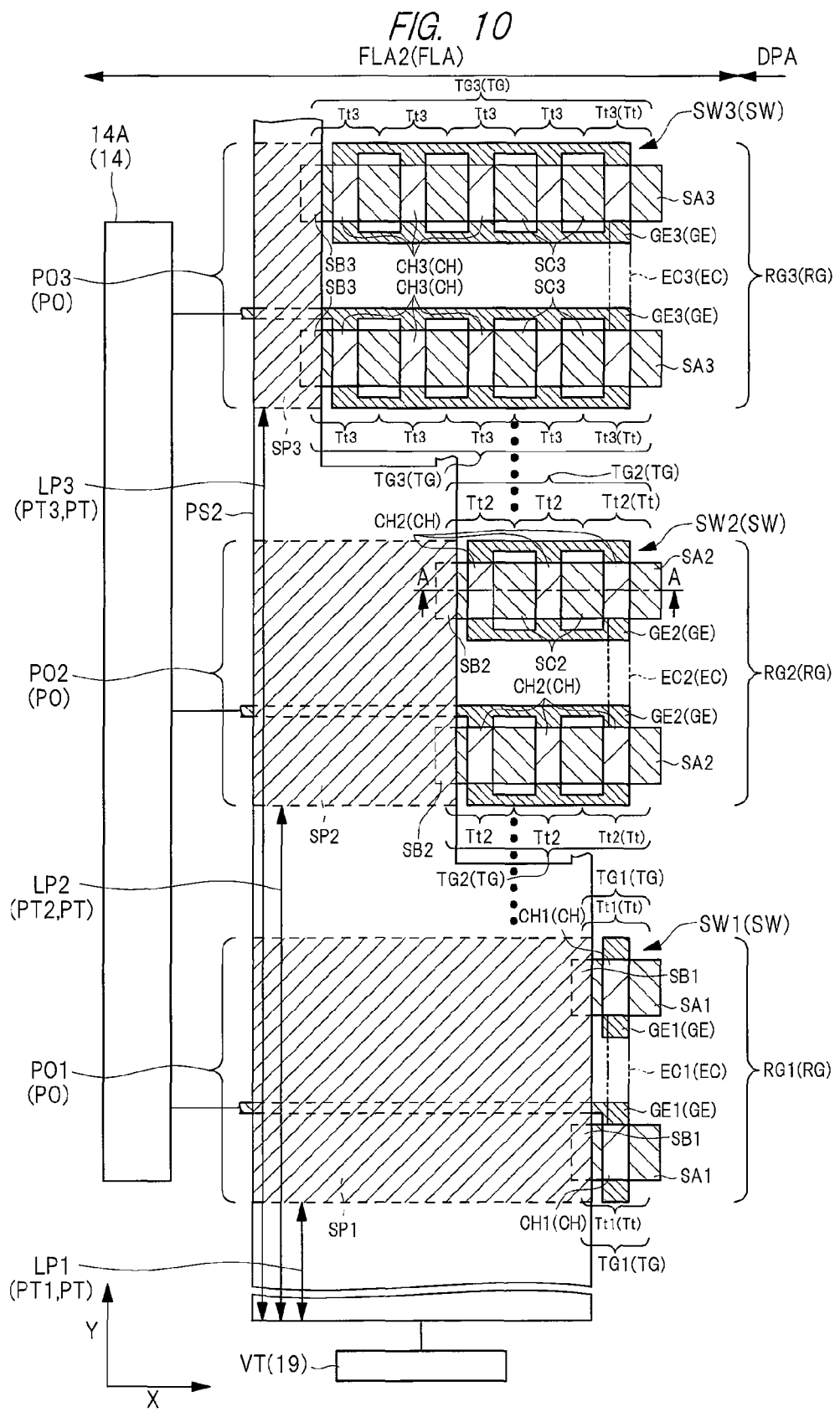
FIG. 10 is a plan view of the power supply wire and the switching unit in the display device according to the embodiment.

As illustrated in FIGS. 9 and 10, each of the plurality of transistors Tt1 includes a gate electrode GE1 serving as a first gate electrode, an electrode EA1 serving as a first A electrode, an electrode EB1 serving as a first B electrode, a channel CH1 serving as a first channel, and regions SA1 and SB1 each of which serves as a source region or a drain region. The electrodes EA1 and EB1 are formed on both sides of the gate electrode GE1 to sandwich the gate electrode GE1. The channel CH1 is a portion of a semiconductor layer SC1 which faces the gate electrode GE1, and the regions SA1 and SB1 are portions of the semiconductor layer SC1 which are formed on both sides of the gate electrode GE1 to sandwich the gate electrode GE1. The electrode EA1 is electrically connected to the region SA1, and the electrode EB1 is electrically connected to the region SB1. Note that the two neighboring transistors Tt1 may share the electrode EA1 or the electrode EB1.

As illustrated in FIGS. 9 to 12, each of the plurality of transistors Tt2 includes a gate electrode GE2 serving as a second gate electrode, an electrode EA2 serving as a second A electrode, an electrode EB2 serving as a second B electrode, a channel CH2 serving as a second channel, and regions SA2 and SB2 each of which serves as the source region or the drain region. The electrodes EA2 and EB2 are formed on both sides of the gate electrode GE2 to sandwich the gate electrode GE2. The channel CH2 is a portion of a semiconductor layer SC2 which faces the gate electrode GE2, and the regions SA2 and SB2 are portions of the semiconductor layer SC2 on both sides of the gate electrode GE2 to sandwich the gate electrode GE2. The electrode EA2 is electrically connected to the region SA2, and the electrode EB2 is electrically connected to the region SB2. Note that the two neighboring transistors Tt2 may share the electrode EA2 or the electrode EB2.

As illustrated in FIGS. 9 and 10, each of the plurality of transistors Tt3 includes a gate electrode GE3 serving as a third gate electrode, an electrode EA3 serving as a third A electrode, an electrode EB3 serving as a third B electrode, a channel CH3 serving as a third channel, and regions SA3 and SB3 each of which serves as the source region or the drain region. The electrodes EA3 and EB3 are formed on both sides of the gate electrode GE3 to sandwich the gate electrode GE3. The channel CH3 is a portion of a semiconductor layer SC3 which faces the gate electrode GE3, and the regions SA3 and SB3 are portions of the semiconductor layer SC3 on both sides of the gate electrode GE3 to sandwich the gate electrode GE3. The electrode EA3 is electrically connected to the region SA3, and the electrode EB3 is electrically connected to the region SB3. Note that the two neighboring transistors Tt3 may share the electrode EA3 or the electrode EB3.

The electrode EA1 is connected to a conductive wire (first conductive wire) WR1, and the electrode EB1 is connected to the power supply wire PS2 in each of the plurality of transistors Tt1. The plurality of transistors Tt1 are formed between the power supply wire PS2 and the conductive wire WR1. The electrode EA2 is connected to a conductive wire (second conductive wire) WR2, and the electrode EB2 is connected to the power supply wire PS2 in each of the plurality of transistors Tt2. The plurality of transistors Tt2 are formed between the power supply wire PS2 and the conductive wire WR2. The electrode EA3 is connected to a conductive wire (third conductive wire) WR3, and the electrode EB3 is connected to the power supply wire PS2 in each of the plurality of transistors Tt3. The plurality of transistors Tt3 are formed between the power supply wire PS2 and the conductive wire WR3.

Note that the conductive wire WR1 is electrically connected to the drive electrode CM1, the conductive wire WR2 is electrically connected to the drive electrode CM2, and the conductive wire WR3 is electrically connected to the drive electrode CM3.

Figure 14:
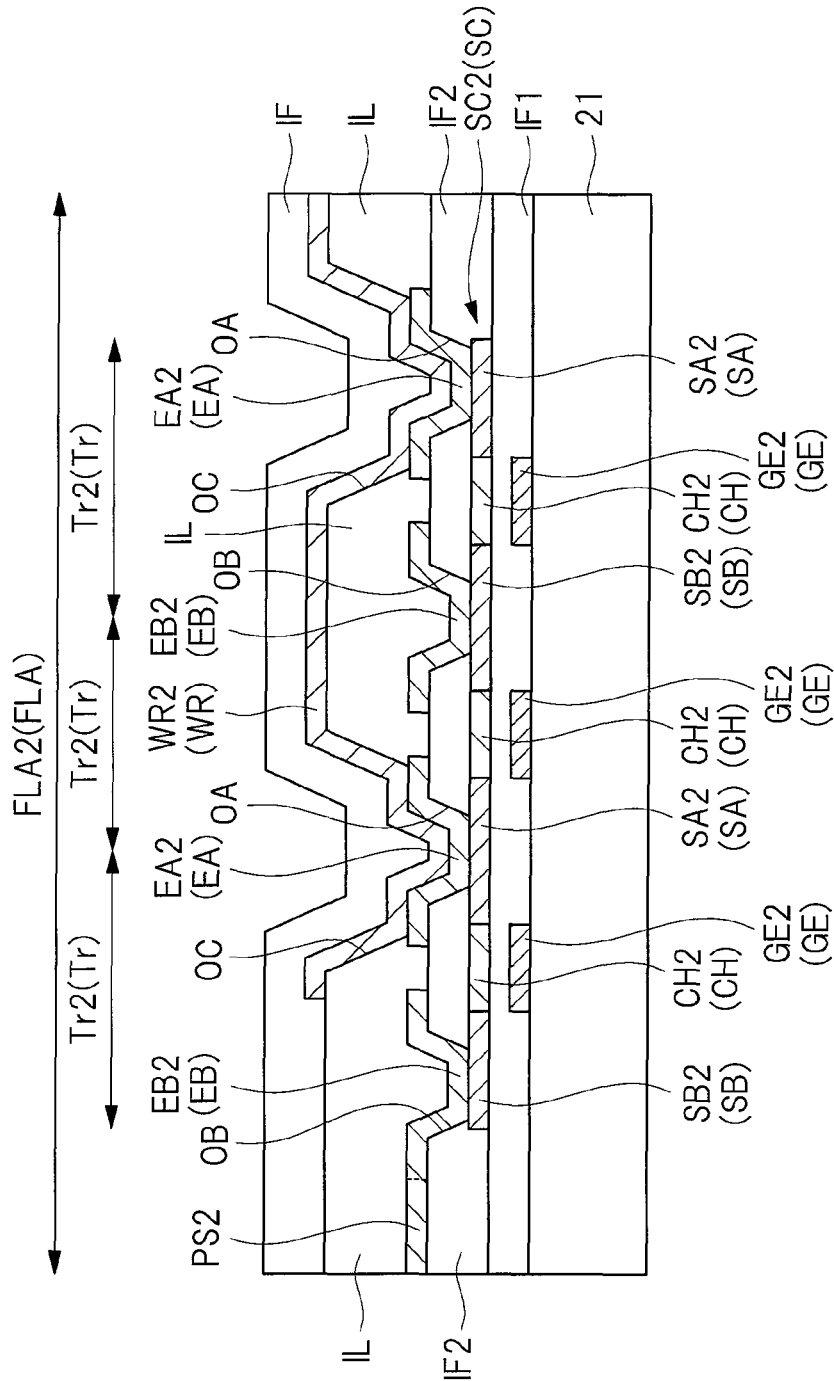
FIG. 14 is a cross-sectional view of the power supply wire and the switching unit in the display device according to the embodiment.

Here, a cross-sectional structure of the periphery of the transistor Tt will be described. FIG. 14 is a cross-sectional view of the power supply wire and the switching unit in the display device according to the embodiment. FIG. 14 illustrates a cross-section taken along a line A-A of FIGS. 9 and 11.

As illustrated in FIG. 14, the gate electrode GE2 serving as the gate electrode GE is formed on the base material 21. The gate electrode GE is made of, for example, metal such as chromium (Cr) and molybdenum (Mo) or an alloy thereof. That is, the gate electrode GE is preferably made of a conducting film having a light shielding property such as a metal film and an alloy film.

An insulating film IF1 serving as a gate insulating film is formed over the base material 21 so as to cover the gate electrode GE. The insulating film IF1 is a transparent insulating film which is made of, for example, silicon nitride, silicon oxide, or the like.

The semiconductor layer SC2 serving as the semiconductor layer SC is formed on the insulating film IF1. As described above, the portion of the semiconductor layer SC facing the gate electrode GE is the channel CH, and the portions of the semiconductor layer SC formed on both sides of the gate electrode GE to sandwich the gate electrode GE are the regions SA and SB. The semiconductor layer SC is made of, for example, amorphous silicon, polycrystalline silicon, or the like.

Note that the transistor Tt has a bottom gate structure in which the gate electrode GE is arranged below the semiconductor layer SC in the example illustrated in FIG. 14. However, the transistor Tt may have a top gate structure in which the gate electrode GE is arranged above the semiconductor layer SC.

An insulating film IF2 is formed over the insulating film IF1 so as to cover the semiconductor layer SC. The insulating film IF2 is a transparent insulating film which is made of, for example, silicon nitride, silicon oxide, or the like.

The opening portion OA which passes through the insulating film IF2 and reaches the region SA, and the opening portion OB which passes through the insulating film IF2 and reaches the region SB are formed in the insulating film IF2. The electrode EA2 serving as the electrode EA is formed on the region SA exposed to a bottom portion of the opening portion OA, a side surface of the opening portion OA, and the insulating film IF2 outside the opening portion OA, and the electrode EB2 serving as the electrode EB is formed on the region SB exposed to a bottom portion of the opening portion OB, a side surface of the opening portion OB, and the insulating film IF2 outside the opening portion OB. Each of the electrodes EA and EB is made of a metal film having a multilayer structure in which, for example, aluminum (Al) is sandwiched between molybdenum (Mo) or the like. That is, each of the electrodes EA and EB is preferably made of a conducting film having a light shielding property such as a metal film.

The power supply wire PS2 is formed on the insulating film IF2. The power supply wire PS2 is formed on the same layer as the electrode EB and is made of the same material as the electrode EB. Further, the electrode EB is connected to the power supply wire PS2.

An interlayer resin film IL is formed over the insulating film IF2 so as to cover the electrodes EA and EB. The interlayer resin film IL is made of, for example, an acrylic photosensitive resin.

The opening portion OC which passes through the interlayer resin film IL and reaches the electrode EA is formed in the interlayer resin film IL. The conductive wire WR2 serving as the conductive wire WR is formed on the electrode EA exposed to a bottom portion of the opening portion OC, a side surface of the opening portion OC, and the interlayer resin film IL outside the opening portion OC. The conductive wire WR is made of a transparent conductive material, for example, indium tin oxide (ITO), indium zinc oxide (IZO), or the like.

The insulating film IF is formed over the interlayer resin film IL so as to cover the conductive wire WR. The insulating film IF is a transparent insulating film which is made of, for example, silicon nitride, silicon oxide, or the like.

As illustrated in FIGS. 9 to 12, the number of the plurality of transistors Tt2 included in the switching unit SW2 is larger than the number of the plurality of transistors Tt1 included in the switching unit SW1 in the display device according to the embodiment. In addition, the number of the plurality of transistors Tt3 included in the switching unit SW3 is larger than the number of the plurality of transistors Tt2 included in the switching unit SW2. FIGS. 9 to 12 illustrate an example in which the switching unit SW1 includes the two transistors Tt1, the switching unit SW2 includes the six transistors Tt2, and the switching unit SW3 includes the ten transistors Tt3.

That is, the total sum of the channel widths Wt2 of the channels CH2 included in the plurality of transistors Tt2 of the switching unit SW2 is larger than the total sum of the channel widths Wt1 of the channels CH1 included in the plurality of transistors Tt1 of the switching unit SW1. In addition, the total sum of the channel widths Wt3 of the channels CH3 included in the plurality of transistors Tt3 of the switching unit SW3 is larger than the total sum of the channel widths Wt2 of the channels CH2 included in the plurality of transistors Tt2 of the switching unit SW2.

As described above, the time constant τ at the time when the signal is input to the drive electrode CM is proportional to the sum of the two resistances R1 and R2 to be described later. The resistance R1 is a resistance of the switching unit SW which is connected between each of the plurality of drive electrodes CM and the power supply wire PS2, in the ON-state. Meanwhile, the resistance R2 is a resistance of the portion PT of the power supply wire PS2 between the switching unit SW and the drive signal generation circuit VT.

In the display device according to the embodiment, the resistance R1 becomes smaller in the drive electrode CM farther from the drive signal generation circuit VT. Meanwhile, the resistance R2 becomes larger in the drive electrode CM farther from the drive signal generation circuit VT. Thus, the sum of the resistance R1 and the resistance R2 is substantially equal in all the drive electrodes CM regardless of the distance from the drive signal generation circuit VT in the display device according to the embodiment as illustrated in FIG. 13. Further, in the display device according to the embodiment, the sum of the resistance R1 and the resistance R2 is larger in the drive electrode CM close to the drive signal generation circuit VT than that of the display device according to the comparative example, and the sum of the resistance R1 and the resistance R2 is smaller in the drive electrode CM far from the drive signal generation circuit VT than that of the display device according to the comparative example.

As described above, the drive electrode CM having the largest time constant τ among the plurality of drive electrodes CM has the greatest influence on the touch detection property. Thus, in the display device according to the embodiment, the influence of the drive electrode CM close to the drive signal generation circuit VT on the touch detection property is larger than that of the display device according to the comparative example, and the influence of the drive electrode CM far from the drive signal generation circuit VT on the touch detection property is smaller than that of the display device according to the comparative example. That is, in the display device according to the embodiment, it is possible to decrease the sum of the resistance R1 and the resistance R2 in the drive electrode CM far from the drive signal generation circuit VT as compared to that of the display device according to the comparative example, so that the touch detection property of the display device can be improved.

Note that, in the case of using each of the plurality of drive electrodes CM as the common electrode for display, it is possible to decrease the sum of the resistance R1 and the resistance R2 in the drive electrode CM far from the drive signal generation circuit VT, so that the display property of the display device can be improved.

However, in the case of using each of the drive electrodes CM as the drive electrode for touch detection, the amount of charge which is charged between the drive electrode CM. and the detection electrode TD is measured, and thus, an error is likely to occur in detection of a position unless the entire charge reaches the drive electrode CM and the detection electrode TD for a certain period of time. Thus, in the case of using each of the plurality of drive electrodes CM as the drive electrode for touch detection, a waveform of a signal input to the drive electrode CM needs to steeply change as compared to the case of using each of the plurality of drive electrodes CM as the common electrode for display, for example, and thus, it is necessary to set the time constant τ to be short.

Preferably, in the display device according to the embodiment, the area SP2 of the portion PO2 (see FIG. 10) of the power supply wire PS2 which faces the region RG2 in which the plurality of transistors Tt2 are formed in the X-axis direction is smaller than the area SP1 of the portion PO1 (see FIG. 10) of the power supply wire PS2 which faces the region RG1 in which the plurality of transistors Tt1 are formed in the X-axis direction. In addition, the area SP3 of the portion PO3 (see FIG. 10) of the power supply wire PS2 which faces the region RG3 in which the plurality of transistors Tt3 are formed in the X-axis direction is smaller than the area SP2 of the portion PO2 (see FIG. 10). Note that FIG. 10 illustrates each of the portions PO1, PO2, and PO3 with hatching.

Accordingly, in the drive electrode CM far from the drive signal generation circuit VT, it is possible to decrease a width of a portion PO of the power supply wire PS2 which faces a region RG in which the plurality of transistors Tt are formed, in the X-axis direction. Thus, it is possible to decrease a width of a region in which the power supply wire PS2 and the plurality of switching units SW are formed in the X-axis direction, so that the width of the frame region FLA can be decreased.

That is, the width of the power supply wire PS2 in the X-axis direction is made smaller in the drive electrode CM farther from the drive signal generation circuit VT, and the area of the region RG in which the switching unit SW including the plurality of transistors Tt is formed is made larger in the drive electrode CM farther from the drive signal generation circuit VT. Accordingly, it is possible to decrease the time constant τ at the time when the signal is input to the drive electrode CM far from the drive signal generation circuit VT without increasing the area of the frame region FLA.

Note that, when the width of the portion PO in the X-axis direction is set to be narrower in the drive electrode CM farther from the drive signal generation circuit VT, a tendency that the resistance R2 becomes larger in the drive electrode CM farther from the drive signal generation circuit VT becomes more conspicuous. However, the resistance R2 is smaller than the resistance R1, and thus, the influence of the increase in the resistance R2 with respect to the sum of the resistance R1 and the resistance R2 is smaller than the influence of the decrease in the resistance R1 with respect to the sum of the resistance R1 and the resistance R2. Accordingly, it is possible to set the sum of the resistance R1 and the resistance R2 to be substantially equal in all the drive electrodes CM regardless of the distance from the drive signal generation circuit VT.

The plurality of transistors Tt1 maybe arrayed in the X-axis direction and the Y-axis direction, the plurality of transistors Tt2 may be arrayed in the X-axis direction and the Y-axis direction, and the plurality of transistors Tt3 may be arrayed in the X-axis direction and the Y-axis direction. In such a case, it is possible to improve a degree of freedom at the time of arranging the plurality of transistors Tt connected to each other in parallel, so that the width of the frame region FLA can be decreased.

Note that, although the example illustrated in FIGS. 9 and 10 illustrates the example in which the two transistors Tt1, the six transistors Tt2, and the ten transistors Tt3 are provided, the six transistors Tt1, the ten transistors Tt2, and the fourteen transistors Tt3 may be provided. In such a case, the six, that is, the plurality of transistors Tt1 are arrayed in the X-axis direction and the Y-axis direction as described above.

Alternatively, each of the plurality of switching units SW may include a plurality of transistor groups TG. Further, the transistor group TG may be formed between the power supply wire PS2 and the conductive wire WR and be connected in parallel with each other in the set of the switching unit SW and the drive electrode CM.

At this time, the switching unit SW1 includes a plurality of transistor groups (first transistor groups) TG1 serving as the transistor group TG. Each of the plurality of transistor groups TG1 includes the plurality of transistors Tt1 arrayed in the X-axis direction. Further, the plurality of transistor groups TG1 are arrayed in the Y-axis direction. The plurality of transistors Tt1 inside the transistor group TG1 are formed between the power supply wire PS2 and the conductive wire WR1 and are connected to each other in parallel.

The switching unit SW2 includes a plurality of transistor groups (second transistor groups) TG2 serving as the transistor group TG. Each of the plurality of transistor groups TG2 includes the plurality of transistors Tt2 arrayed in the X-axis direction. Further, the plurality of transistor groups TG2 are arrayed in the Y-axis direction. The plurality of transistors Tt2 inside the transistor group TG2 are formed between the power supply wire PS2 and the conductive wire WR2 and are connected to each other in parallel.

The switching unit SW3 includes a plurality of transistor groups TG3 serving as the transistor group TG. Each of the plurality of transistor groups TG3 includes the plurality of transistors Tt3 arrayed in the X-axis direction. Further, the plurality of transistor groups TG3 are arrayed in the Y-axis direction. The plurality of transistors Tt3 inside the transistor group TG3 are formed between the power supply wire PS2 and the conductive wire WR3 and are connected to each other in parallel.

Note that the two gate electrodes GE1 included, respectively, in the neighboring two transistor groups TG1 are electrically connected to each other via an electrode EC1 serving as an electrode EC as illustrated in FIGS. 9 and 10. For example, the electrode EC1 is electrically connected to the gate electrode GE1 via an opening portion OD (see FIGS. 11 and 12) which passes through the insulating films IF2 and IF1 (see FIG. 14) and reaches the gate electrode GE1.

In addition, the two gate electrodes GE2 included, respectively, in the neighboring two transistor groups TG2 are electrically connected to each other via an electrode EC2 serving as the electrode EC as illustrated in FIGS. 9 to 12. For example, the electrode EC2 is electrically connected to the gate electrode GE2 via the opening portion OD (see FIGS. 11 and 12) which passes through the insulating films IF2 and IF1 (see FIG. 14) and reaches the gate electrode GE2.

In addition, the two gate electrodes GE3 included, respectively, in the neighboring two transistor groups TG3 are electrically connected to each other via an electrode EC3 serving as the electrode EC as illustrated in FIGS. 9 and 10. For example, the electrode EC3 is electrically connected to the gate electrode GE3 via the opening portion OD (see FIGS. 11 and 12) which passes through the insulating films IF2 and IF1 (see FIG. 14) and reaches the gate electrode GE3.

The length LP2 of the portion PT2 of the power supply wire PS2 between the plurality of transistor groups TG2 and the drive signal generation circuit VT is longer than the length LP1 of the portion PT1 of the power supply wire PS2 between the plurality of transistor groups TG1 and the drive signal generation circuit VT. In addition, the length LP3 of the portion PT3 of the power supply wire PS2 between the plurality of transistor groups TG3 and the drive signal generation circuit VT is longer than the length LP2 of the portion PT2 of the power supply wire PS2 between the plurality of transistor groups TG2 and the drive signal generation circuit VT.

Note that the two transistor groups TG1 each of which includes the three transistors Tt1 are arrayed in the Y-axis direction when the six transistors Tt1, the ten transistors Tt2, and the fourteen transistors Tt3 are provided as described above.

In addition, as described above, when the plurality of switching units SW supply the display drive signal VcomDC (see FIG. 3) to each of the plurality of drive electrodes CM in a switching manner based on the drive signal from the drive electrode driver 14, the drive electrode CM is not necessarily the drive electrode for touch detection. At this time, the display device does not necessarily have the touch detection function.

In this embodiment, the number of the transistors Tt connected to each other in parallel is increased in the drive electrode CM far from the drive signal generation circuit VT, so that the total sum of channel widths is increased. However, the total sum of channel widths may be increased by setting the number of the transistors Tt connected to each other in parallel to be equal in the drive electrode CM far from the drive signal generation circuit VT and increasing the channel width of the single transistor Tt.

In addition, the gate electrode GE extends in the Y-axis direction in each of the transistors Tt in this embodiment. However, the gate electrode GE may extend in the X-axis direction.

Alternatively, the conductive wire WR may be a conductive wire connected to the scan line GL instead of the drive electrode CM. At this time, the switching unit SW may be a buffer transistor in a peripheral circuit that drives each of the scan lines GL, and the power supply wire PS2 may be a power supply wire that supplies a signal to each of the scan lines GL.

<Modification Example of Display Device According to Embodiment>

Next, a modification example of the embodiment will be described. FIGS. 15 and 16 are views schematically illustrating the configuration of the power supply wire and the switching unit in the display device according to the modification example of the embodiment. FIG. 15 illustrates an example in which the three drive electrodes CM are provided, and FIG. 16 illustrates an example in which the 62 drive electrodes CM are provided from a first row (LN=1) to a 62nd row (LN=62). Note that FIG. 15 does not illustrate a detailed internal structure of the transistor Tt. In addition, FIG. 16 schematically illustrates positional dependence of the drive electrode CM in the set of the drive electrode CM and the switching unit SW with a width WS of the region RG in which the switching unit SW is formed in the X-axis direction and a width WP of the portion PO of the power supply wire PS2 which faces the region RG in the X-axis direction.

As illustrated in FIG. 15, a display device according to the modification example includes a switching unit SW4 between the switching unit SW1 and the switching unit SW2. The switching unit SW4 includes a plurality of transistor groups (third transistor groups) TG4 serving as the transistor group TG and a plurality of transistor groups (fourth transistor groups) TG5 serving as the transistor group TG. The plurality of transistor groups TG4 and the plurality of transistor groups TG5 are arrayed in the Y-axis direction, formed between the power supply wire PS2 and the conductive wire WR, and connected to each other in parallel.

Each of the plurality of transistor groups TG1 includes the N1 (a first number) transistors Tt1 arrayed in the X-axis direction, where N1 is two or more. Each of the plurality of transistor groups TG2 includes the N2 (a second number) transistors Tt2 arrayed in the X-axis direction, where N2 is more than N1. Each of the plurality of transistor groups TG4 includes the N1 transistors (fourth transistors) Tt2 arrayed in the X-axis direction. Each of the plurality of transistor groups TG5 includes the N2 transistors (fourth transistors) Tt2 arrayed in the X-axis direction.

Each of the N1 transistors Tt2 included in the transistor group TG4 includes the gate electrode GE2 (see FIG. 14) serving as a fourth gate electrode, the electrode EA2 (see FIG. 14) serving as a fourth A electrode, the electrode EB2 (see FIG. 14) serving as a fourth B electrode, and the channel CH2 (see FIG. 14) serving as a fourth channel. In addition, each of the N2 transistors Tt2 included in the transistor group TG5 includes the gate electrode GE2 (see FIG. 14) serving as the fourth gate electrode, the electrode EA2 (see FIG. 14) serving as the fourth A electrode, the electrode EB2 (see FIG. 14) serving as the fourth B electrode, and the channel CH2 (see FIG. 14) serving as the fourth channel. The electrode EA2 is connected to the conductive wire WR2, and the electrode EB2 is connected to the power supply wire PS2. In addition, the conductive wires WR2 connected to the respective transistor groups TG4 and TG5 are connected to a drive electrode CM4 as illustrated in FIG. 15.

A length LP4 of a portion PT4 of the power supply wire PS2 between the plurality of transistor groups TG4 and the plurality of transistor groups TG5, and the drive signal generation circuit VT is longer than the length LP1 of the portion PT1 of the power supply wire PS2 between the plurality of transistor groups TG1 and the drive signal generation circuit VT. In addition, the length LP4 of the portion PT4 of the power supply wire PS2 between the plurality of transistor groups TG4 and the plurality of transistor groups TG5, and the drive signal generation circuit VT is shorter than the length LP2 of the portion PT2 of the power supply wire PS2 between the plurality of transistor groups TG2 and the drive signal generation circuit VT.

In the example illustrated in FIG. 15, the number (N1) of the transistors Tt1 included in each of the plurality of transistor groups TG1 in the switching unit SW1 is set to three, and the number (N2) of the transistors Tt2 included in each of the plurality of transistor groups TG2 in the switching unit SW2 is set to five. At this time, an average number of the transistors Tt2 included in each of the plurality of transistor groups TG4 and the plurality of transistor groups TG5 in the switching unit SW4 can be set to four. Thus, it is possible to finely change the width WS of the region RG in which the switching unit SW is formed in the X-axis direction as illustrated in FIG. 16 without finely changing the number of transistors Tt (see FIG. 15) included in each of the transistor groups TG (see FIG. 15). That is, it is possible to smoothly change the width WS of the region RG in which the switching unit SW is formed in the X-axis direction and the width WP of the portion PO of the power supply wire PS2 which faces the region RG in the X-axis direction from the drive electrode CM on the first row to the drive electrode CM on the 62nd row as illustrated in FIG. 16.

In other words, it is unnecessary to finely change the number of the transistors Tt included in each of the transistor groups TG even in the case of finely changing the width WS of the region RG in which the switching unit SW is formed in the X-axis direction, and thus, it is possible to make a mask design easy, which results in reduction in manufacturing cost of the display device.

In the foregoing, the invention made by the inventor of the present invention has been concretely described based on the embodiment. However, it is needless to say that the present invention is not limited to the foregoing embodiment and various modifications and alterations can be made within the scope of the present invention.

In addition, the case of the liquid crystal display device has been exemplified as the disclosed example in the above-described embodiment, but other application examples may include various types of flat panel display devices such as an organic EL display device, other self-luminous display devices, and an electronic paper display device including an electrophoretic element. In addition, it is needless to say that the invention can be applied to a small size to a large size without being particularly limited.

Various modifications and alterations can be conceived by those skilled in the art within the spirit of the present invention, and it is understood that such modifications and alterations are also encompassed within the scope of the present invention.

For example, those skilled in the art can suitably modify the above-described embodiment by addition, deletion, or design change of components, or by addition, omission, or condition change of steps. Such modifications are also encompassed within the scope of the present invention as long as they include the gist of the present invention.

The present invention is advantageous when being applied to a transistor substrate and a display device.

What is claimed is:

1. A transistor substrate which has a display region in which a pixel is formed and a peripheral region positioned outside the display region, the transistor substrate comprising:
   a common wire formed in the peripheral region;
   a control circuit connected to one end of the common wire;
   a first conductive wire and a second conductive wire which are formed to be spaced apart from the common wire;
   a plurality of first transistors formed between the common wire and the first conductive wire; and
   a plurality of second transistors formed between the common wire and the second conductive wire,
   wherein each of the plurality of first transistors includes:
      a first gate electrode;
      a first A electrode and a first B electrode which are formed on both sides of the first gate electrode to sandwich the first gate electrode; and
      a first channel facing the first gate electrode,
   wherein each of the plurality of second transistors includes:
      a second gate electrode;
      a second A electrode and a second B electrode which are formed on both sides of the second gate electrode to sandwich the second gate electrode; and
      a second channel facing the second gate electrode,
   wherein the first A electrode is connected to the first conductive wire, and the first B electrode is connected to the common wire, in each of the plurality of first transistors,
   wherein the second A electrode is connected to the second conductive wire, and the second B electrode is connected to the common wire, in each of the plurality of second transistors,
   wherein a length of a portion of the common wire between the plurality of second transistors and the control circuit is longer than a length of a portion of the common wire between the plurality of first transistors and the control circuit, and
   wherein a total sum of channel widths of the second channels included in the plurality of second transistors is wider than a total sum of channel widths of the first channels included in the plurality of first transistors.

2. The transistor substrate according to claim 1,
   wherein, when a direction intersecting an extending direction of the common wire is set to a width direction,
   an area of a portion of the common wire which faces a region in which the plurality of second transistors are formed in the width direction is smaller than an area of a portion of the common wire which faces a region in which the plurality of first transistors are formed in the width direction.

3. The transistor substrate according to claim 2, further comprising:
   a third conductive wire formed to be spaced apart from the common wire; and
   a plurality of third transistors formed between the common wire and the third conductive wire,
   wherein each of the plurality of third transistors includes:
      a third gate electrode;
      a third A electrode and a third B electrode which are formed on both sides of the third gate electrode to sandwich the third gate electrode; and
      a third channel facing the third gate electrode,
   wherein the third A electrode is connected to the third conductive wire, and the third B electrode is connected to the common wire, in each of the plurality of third transistors,
   wherein a length of a portion of the common wire between the plurality of third transistors and the control circuit is longer than the length of the portion of the common wire between the plurality of second transistors and the control circuit, and
   wherein a total sum of channel widths of the third channels included in the plurality of third transistors is wider than the total sum of the channel widths of the second channels included in the plurality of second transistors.

4. The transistor substrate according to claim 2,
   wherein, when a direction intersecting an extending direction of the common wire is set to a width direction,
   the plurality of second transistors are arrayed in the extending direction and the width direction.

5. The transistor substrate according to claim 2, further comprising:
   a plurality of first transistor groups which are formed between the common wire and the first conductive wire and are connected to each other in parallel; and
   a plurality of second transistor groups which are formed between the common wire and the second conductive wire and are connected to each other in parallel,
   wherein, when a direction intersecting an extending direction of the common wire is set to a width direction,
   the plurality of first transistor groups are arrayed in the extending direction,
   wherein the plurality of second transistor groups are arrayed in the extending direction,
   wherein each of the plurality of first transistor groups includes the plurality of first transistors arrayed in the width direction,
   wherein each of the plurality of second transistor groups includes the plurality of second transistors arrayed in the width direction, and
   wherein a length of a portion of the common wire between the plurality of second transistor groups and the control circuit is longer than a length of a portion of the common wire between the plurality of first transistor groups and the control circuit.

6. The transistor substrate according to claim 2, further comprising:
   a first common electrode and a second common electrode which are formed in the display region,
   wherein the first common electrode serves also as a first detection electrode which detects proximity or contact of an object,
   wherein the second common electrode serves also as a second detection electrode which detects proximity or contact of the object,
   wherein the first common electrode is electrically connected to the first conductive wire, and
   wherein the second common electrode is electrically connected to the second conductive wire.

7. The transistor substrate according to claim 1, further comprising:
   a third conductive wire formed to be spaced apart from the common wire; and a plurality of third transistors formed between the common wire and the third conductive wire,
wherein each of the plurality of third transistors includes:
a third gate electrode;
a third A electrode and a third B electrode which are formed on both sides of the third gate electrode to sandwich the third gate electrode; and
a third channel facing the third gate electrode,
wherein the third A electrode is connected to the third conductive wire, and the third B electrode is connected to the common wire, in each of the plurality of third transistors,
wherein a length of a portion of the common wire between the plurality of third transistors and the control circuit is longer than the length of the portion of the common wire between the plurality of second transistors and the control circuit, and
wherein a total sum of channel widths of the third channels included in the plurality of third transistors is wider than the total sum of the channel widths of the second channels included in the plurality of second transistors.

8. The transistor substrate according to claim 7,
wherein, when a direction intersecting an extending direction of the common wire is set to a width direction,
an area of a portion of the common wire which faces a region in which the plurality of second transistors are formed in the width direction is smaller than an area of a portion of the common wire which faces a region in which the plurality of first transistors are formed in the width direction, and
wherein an area of a portion of the common wire which faces a region in which the plurality of third transistors are formed in the width direction is smaller than the area of the portion of the common wire which faces the region in which the plurality of second transistors are formed in the width direction.

9. The transistor substrate according to claim 8,
wherein, when a direction intersecting an extending direction of the common wire is set to a width direction,
the plurality of second transistors are arrayed in the extending direction and the width direction.

10. The transistor substrate according to claim 8, further comprising:
a plurality of first transistor groups which are formed between the common wire and the first conductive wire and are connected to each other in parallel; and
a plurality of second transistor groups which are formed between the common wire and the second conductive wire and are connected to each other in parallel,
wherein, when a direction intersecting an extending direction of the common wire is set to a width direction,
the plurality of first transistor groups are arrayed in the extending direction,
wherein the plurality of second transistor groups are arrayed in the extending direction,
wherein each of the plurality of first transistor groups includes the plurality of first transistors arrayed in the width direction,
wherein each of the plurality of second transistor groups includes the plurality of second transistors arrayed in the width direction, and
wherein a length of a portion of the common wire between the plurality of second transistor groups and the control circuit is longer than a length of a portion of the common wire between the plurality of first transistor groups and the control circuit.

11. The transistor substrate according to claim 7,
wherein, when a direction intersecting an extending direction of the common wire is set to a width direction,
the plurality of second transistors are arrayed in the extending direction and the width direction.

12. The transistor substrate according to claim 7, further comprising:
a plurality of first transistor groups which are formed between the common wire and the first conductive wire and are connected to each other in parallel; and
a plurality of second transistor groups which are formed between the common wire and the second conductive wire and are connected to each other in parallel,
wherein, when a direction intersecting an extending direction of the common wire is set to a width direction,
the plurality of first transistor groups are arrayed in the extending direction,
wherein the plurality of second transistor groups are arrayed in the extending direction,
wherein each of the plurality of first transistor groups includes the plurality of first transistors arrayed in the width direction,
wherein each of the plurality of second transistor groups includes the plurality of second transistors arrayed in the width direction, and
wherein a length of a portion of the common wire between the plurality of second transistor groups and the control circuit is longer than a length of a portion of the common wire between the plurality of first transistor groups and the control circuit.

13. The transistor substrate according to claim 1,
wherein, when a direction intersecting an extending direction of the common wire is set to a width direction,
the plurality of second transistors are arrayed in the extending direction and the width direction.

14. The transistor substrate according to claim 13,
wherein the plurality of first transistors are arrayed in the extending direction and the width direction.

15. The transistor substrate according to claim 14, further comprising:
a plurality of first transistor groups which are formed between the common wire and the first conductive wire and are connected to each other in parallel; and
a plurality of second transistor groups which are formed between the common wire and the second conductive wire and are connected to each other in parallel,
wherein, when a direction intersecting an extending direction of the common wire is set to a width direction,
the plurality of first transistor groups are arrayed in the extending direction,
wherein the plurality of second transistor groups are arrayed in the extending direction,
wherein each of the plurality of first transistor groups includes the plurality of first transistors arrayed in the width direction,
wherein each of the plurality of second transistor groups includes the plurality of second transistors arrayed in the width direction, and
wherein a length of a portion of the common wire between the plurality of second transistor groups and the control circuit is longer than a length of a portion of the common wire between the plurality of first transistor groups and the control circuit.

16. The transistor substrate according to claim 13, further comprising:

a plurality of first transistor groups which are formed between the common wire and the first conductive wire and are connected to each other in parallel; and a plurality of second transistor groups which are formed between the common wire and the second conductive wire and are connected to each other in parallel, wherein, when a direction intersecting an extending direction of the common wire is set to a width direction, the plurality of first transistor groups are arrayed in the extending direction, wherein the plurality of second transistor groups are arrayed in the extending direction, wherein each of the plurality of first transistor groups includes the plurality of first transistors arrayed in the width direction, wherein each of the plurality of second transistor groups includes the plurality of second transistors arrayed in the width direction, and wherein a length of a portion of the common wire between the plurality of second transistor groups and the control circuit is longer than a length of a portion of the common wire between the plurality of first transistor groups and the control circuit.

17. The transistor substrate according to claim 1, further comprising:

a plurality of first transistor groups which are formed between the common wire and the first conductive wire and are connected to each other in parallel; and a plurality of second transistor groups which are formed between the common wire and the second conductive wire and are connected to each other in parallel, wherein, when a direction intersecting an extending direction of the common wire is set to a width direction, the plurality of first transistor groups are arrayed in the extending direction, wherein the plurality of second transistor groups are arrayed in the extending direction, wherein each of the plurality of first transistor groups includes the plurality of first transistors arrayed in the width direction, wherein each of the plurality of second transistor groups includes the plurality of second transistors arrayed in the width direction, and wherein a length of a portion of the common wire between the plurality of second transistor groups and the control circuit is longer than a length of a portion of the common wire between the plurality of first transistor groups and the control circuit.

18. The transistor substrate according to claim 17, further comprising:

a fourth conductive wire formed to be spaced apart from the common wire; and a plurality of third transistor groups and a plurality of fourth transistor groups which are formed between the common wire and the fourth conductive wire and are connected to each other in parallel, wherein the plurality of third transistor groups and the plurality of fourth transistor groups are arrayed in the extending direction, wherein each of the plurality of first transistor groups includes a first number of the first transistors arrayed in the width direction, the first number being two or more, wherein each of the plurality of second transistor groups includes a second number of the second transistors arrayed in the width direction, the second number being larger than the first number, wherein each of the plurality of third transistor groups includes the first number of fourth transistors arrayed in the width direction, wherein each of the plurality of fourth transistor groups includes the second number of the fourth transistors arrayed in the width direction, wherein the fourth transistor includes:

a fourth gate electrode;

a fourth A electrode and a fourth B electrode which are formed on both sides of the fourth gate electrode to sandwich the fourth gate electrode; and a fourth channel facing the fourth gate electrode, wherein the fourth A electrode is connected to the fourth conductive wire, and the fourth B electrode is connected to the common wire, in the fourth transistor, wherein a length of a portion of the common wire between the plurality of third transistor groups and the plurality of fourth transistor groups, and the control circuit is longer than the length of the portion of the common wire between the first transistor group and the control circuit, and wherein the length of the portion of the common wire between the plurality of third transistor groups and the plurality of fourth transistor groups, and the control circuit is shorter than the length of the portion of the common wire between the second transistor group and the control circuit.

19. The transistor substrate according to claim 1, further comprising:

a first common electrode and a second common electrode which are formed in the display region, wherein the first common electrode serves also as a first detection electrode which detects proximity or contact of an object, wherein the second common electrode serves also as a second detection electrode which detects proximity or contact of the object, wherein the first common electrode is electrically connected to the first conductive wire, and wherein the second common electrode is electrically connected to the second conductive wire.

20. A display device comprising:

the transistor substrate according to claim 1.

* * * * *